(12) United States Patent
Peterson

(10) Patent No.: US 6,956,283 B1
(45) Date of Patent: Oct. 18, 2005

(54) ENCAPSULANTS FOR PROTECTING MEMS DEVICES DURING POST-PACKAGING RELEASE ETCH

(76) Inventor: Kenneth A. Peterson, 7013 Vivian Dr. NE., Albuquerque, NM (US) 87109

(*) Notice: Subject to any disclaimer, the term of this patent is extended or adjusted under 35 U.S.C. 154(b) by 0 days.

(21) Appl. No.: 10/606,525

(22) Filed: Jun. 26, 2003

Related U.S. Application Data

(60) Continuation-in-part of application No. 09/955,722, filed on Sep. 18, 2001, now Pat. No. 6,844,623, which is a division of application No. 09/572,562, filed on May 16, 2000, now Pat. No. 6,335,224.

(60) Provisional application No. 60/438,028, filed on Jan. 2, 2003.

(51) Int. Cl.[7] .......................... H01L 23/02; H01L 23/48; H01L 23/52; H01L 23/40
(52) U.S. Cl. ...................... 257/680; 257/690; 257/778; 257/784; 257/787
(58) Field of Search ............................... 257/680, 690, 257/737–738, 780, 782–784, 787–796, 778

(56) References Cited

U.S. PATENT DOCUMENTS

| | | | |
|---|---|---|---|
| 5,061,657 A | 10/1991 | Queen et al. .............. 437/239 |
| 5,587,090 A | 12/1996 | Belcher et al. .............. 216/17 |
| 5,622,898 A | 4/1997 | Zechman ..................... 438/127 |
| 6,238,580 B1 | 5/2001 | Cole et al. ...................... 216/2 |
| 6,274,514 B1 | 8/2001 | Jang et al. ................... 438/778 |
| 6,303,977 B1 | 10/2001 | Schroen et al. ............. 257/635 |
| 6,455,927 B1 * | 9/2002 | Glenn et al. ................. 257/686 |
| 6,472,739 B1 | 10/2002 | Wood et al. ................. 257/704 |
| 6,511,859 B1 | 1/2003 | Jiang et al. ................... 438/48 |

OTHER PUBLICATIONS

Cole, Robertson, Swenson, & Osborn, "*MEMS Packaging Technique Using HF Vapor Release*", ICAPS Meeting Mar., 2002.

* cited by examiner

Primary Examiner—Shouxiang Hu
(74) Attorney, Agent, or Firm—Robert D. Watson; Jeffrey D. Myers

(57) ABSTRACT

The present invention relates to methods to protect a MEMS or microsensor device through one or more release or activation steps in a "package first, release later" manufacturing scheme: This method of fabrication permits wirebonds, other interconnects, packaging materials, lines, bond pads, and other structures on the die to be protected from physical, chemical, or electrical damage during the release etch(es) or other packaging steps. Metallic structures (e.g., gold, aluminum, copper) on the device are also protected from galvanic attack because they are protected from contact with HF or HCL-bearing solutions.

15 Claims, 36 Drawing Sheets

ENCAPSULANTS FOR PROTECTING MEMS DEVICES DURING POST-PACKAGING RELEASE ETCH

CROSS-REFERENCE TO RELATED APPLICATIONS

This application is a continuation-in-part application of U.S. patent application Ser. No. 09/955,722, entitled "Temporary Coatings for Protection of Microelectronic Devices During Packaging", to Kenneth A. Peterson et al., filed on Sep. 18, 2001, now U.S. Pat. No. 6,844,623 which was a division of U.S. patent application Ser. No. 09/572,562, filed May 16, 2000, now U.S. Pat. No. 6,335,224, "Protection of Microelectronic Devices During Packaging", and the specifications thereof are incorporated herein by reference. This application claims the benefit of U.S. Provisional Application No. 60/438,028, "Encapsulants for Protecting MEMS Devices During Post-Packaging Release Etch", filed Jan. 2, 2003, which is incorporated herein by reference.

GOVERNMENT RIGHTS

The Government has rights to this invention pursuant to Contract No. DE-AC04-94AL85000 awarded by the U.S. Department of Energy.

BACKGROUND OF THE INVENTION

The present invention relates generally to the field of microelectronics packaging and more specifically to packaging of microelectromechanical systems (MEMS) and integrated microelectromechanical systems (IMEMS) devices.

For current commercially packaged MEMS and IMEMS components, the steps of packaging and testing can account for at least 70% of the cost. The current low-yield of MEMS packaging is a "show-stopper" for the eventual success of MEMS. Conventional electronic packaging methods, although expensive, are not presently adequate to carry these designs to useful applications with acceptable yields and reliability.

Examples of MEMS and IMEMS devices include airbag accelerometers, microengines, optical switches, gyroscopic devices, sensors, imaging and microfluidic actuators. IMEMS devices can combine integrated circuits (IC's), such as CMOS or bipolar circuits, with the MEMS devices on a single substrate side-by-side, such as a multi-chip module (MCM). All of these devices use active elements (e.g., gears, hinges, levers, slides, mirrors, valves, etc.). These freestanding structures must be free to move, rotate, etc. during operation. Other types of microelectronics devices, such as microsensors, must be accessible and freely exposed to the environment during operation (e.g., for making chemical, pressure, or temperature measurements). Likewise, optical elements need to be accessible to the outside either directly or through a transparent window.

During conventional Surface Micro Machined (SMM) MEMS fabrication, silicon dioxide, silicate glass, or silicon nitride is used as a sacrificial material commonly used at the wafer scale to enable creation of complex, three-dimensional structural shapes from polycrystalline silicon (e.g., polysilicon or "poly"). The sacrificial layer (or layers) surrounds and covers the structural polysilicon MEMS elements, preventing them from moving freely during MEMS fabrication. At this stage, the MEMS elements are commonly referred to as being "unreleased".

The next step is to "release" and make free the MEMS elements. Conventionally, this is done by etching and dissolving the sacrificial coating (typically $SiO_2$) in a liquid solution of hydrofluoric acid (HF), hydrochloric acid (HCL), or a combination of both (e.g., a 50/50 mix). This wet etching step is conventionally done at the wafer scale in order to reduce processing costs. Other additions may improve stiction resistance. HF vapor release can also be used (the vapor arises from a mixture of HF and water, and, so is not completely dry.

After releasing the active elements, the MEMS devices are generally probed to test their functionality. Unfortunately, probed "good" MEMS devices are then lost in significant quantity due to damage during subsequent packaging steps. They can be easily damaged because they are unprotected (e.g. released). Subsequent processing steps can include sawing or cutting (e.g. dicing) the wafer into individual chips or device dies; attaching the device to the package (e.g. die attach), wirebonding or flip-chip mounting, solder bumping, direct metallization, pre-seal inspection; sealing of hermetic or dust protection lids; windowing; package sealing; plating; trim; marking; final test; shipping; storage; and installation. Potential risks to the delicate released MEMS elements include electrostatic effects, dust, moisture, contamination, handling stresses, and thermal effects. For example, ultrasonic bonding of wirebond joints can impart harmful vibrations to the fragile released MEMS elements. In the case of microsensors, the active sensing elements (e.g., chemically reactive films), may be damaged if exposed prematurely during the packaging process.

One solution to this problem is to keep the original sacrificial coating intact for as long as possible during fabrication. In one approach, the MEMS elements would be released (or microsensing elements made active by exposing them to the ambient environment) after all of the high-risk packaging steps have been completed. This is referred to generally as a "package first, release later" scheme.

Some problems exist with the use of wet acid etchants for releasing MEMS devices. There are safety and environmental disposal issues with using strong acids like HF and HCL. Also, the acid can attack and damage other features on the microelectronic device, including metal traces, lines, structures, films, bond pads, routing lines between bond pads, wirebonds, solder bumps, ring seals, bond interfaces, metallized layers, sensing materials, integrated circuits, such as CMOS or Bipolar structures and other semiconductor materials (e.g., standard photoresist protection used on CMOS or Bipolar chips may not provide sufficient protection from attack by acid etchants). Use of wet release etchants can also damage other fragile structures due to hydrodynamic forces, including alignment marks, logos, and test structures, wirebonds (e.g., due to wire sweep). Also, unprotected metallic structures (e.g., gold, aluminum, copper) on the device can be corroded by galvanic attack of the HF-bearing or HCL-bearing release solution.

Alternatively, a dry release etch may be performed by using a reactive plasma containing reactive oxygen, chlorine, or fluorine ions, or combinations thereof to remove the sacrificial layer(s). This eliminates the above-mentioned problems with using a liquid etchant, but is typically a slower process.

Released MEMS elements are often coated with a very thin (e.g., monolayers) anti-stiction, anti-adhesion, lubricating coating, (e.g. perfluoropolyether, hexamethyldisilazane, or perfluorodecanoic carboxylic acid, self-assembling monolayered films), and then dried.

In conventional microelectronics packaging, a common final packaging step (i.e., after mounting, wirebonding, soldering, for example) is to apply a protective, water-resistant coating of a parylene-type polymer or an epoxy encapsulant (glob) to all surfaces that might be exposed to moisture, etc. and to ruggedize the package. However, such relatively thick protective coatings cannot be applied to released MEMS elements (or to exposed microsensing elements), because the coating would prevent the MEMS elements from moving (or, for example, prevent diaphragms or membranes in a pressure-sensitive element from flexing).

Conventional photoresist materials have been used in packaged microelectronic devices for environmental protection. However, because of their high viscosity (from 1000–17,000 cts), delicate wirebonds can be damaged due to excessive wire sweep caused by high viscous shear forces applied during deposition of the photoresist (e.g., during spin coating).

Also, in conventional fabrication of MEMS devices that use movable micromirrors (e.g., for digital light projectors, DLP's), a common final packaging step is to deposit a flash of gold (possibly with a Ti or Cr adhesion layer (Cr survives release etch)) onto the mirror surfaces to give them the desired reflectance or other optical properties (but not being so thick as to interfere with their motion). However, this step requires that the surrounding areas containing electrically conductive lines, pads, wires, etc. are masked off to prevent the conductive gold film from short-circuiting them.

Also, problems can exist from excessive electromagnetic cross-talk interference between neighboring conductors (signal lines, power lines, wirebonds, etc.) because they are electromagnetically unshielded from each other. A thin, metallic overcoat could act as an electromagnetic shield, but this would also short-circuit the device since the exposed metallic conductors are not electrically insulated. This would require that each individual conductor (e.g., gold wirebond) be coated with an insulating layer (which is not presently done, because application of the insulating layer would coat the released MEMS elements and prevent them from functioning).

The parent applications to the present invention describe certain disadvantages of prior art techniques and disclose methods for protecting MEMS and IMEMS particularly during packaging. The present invention provides for protecting such devices through a release etch or etches.

What is needed, therefore, is a method for protecting not only MEMS elements and microsensor elements in the "active" area of a device, but also integrated circuits, other structures on the die, contact/bond pads, wirebonds, other interconnects, solders, packaging materials, adhesives, etc. in the "passive" area from physical, chemical, or electrical damage during release or other activation procedures in a "package first, release later" scheme, without having to use a thick, bulk encapsulant (such as plastic injection molding).

SUMMARY OF THE INVENTION

The present invention relates to methods to protect a MEMS or microsensor device through one or more release or activation steps in a "package first, release later" manufacturing scheme. This method of fabrication permits wirebonds, other interconnects, packaging materials, lines, bond pads, and other structures on the die to be protected from physical, chemical, or electrical damage during the release etch(es) or other packaging steps. Metallic structures (e.g., gold, aluminum, copper, nickel) on the device are also protected from galvanic attack because they are protected from contact with HF or HCL acids used for release etch(s).

In one embodiment, a vapor-deposited, conformal coating (e.g., parylene) is applied after the (unreleased) device has been die-attached and wirebonded to a package substrate. The parylene is either prevented from being applied to, or is subsequently removed from, the active MEMS area, and then the device is released with well-known release/coat/dry techniques.

In another embodiment, as much of the packaged, but not yet released, device as desired is coated with a photoimagable, liquid encapsulant having a low viscosity (e.g., SU-8). The surplus thickness of the low-viscosity encapsulant (which can be warmed to further lower its viscosity) is drained off the part, leaving a thin, substantially conformal, electrically insulating coating. The region over the active area is easily photodefined and then removed. Then the device is released with known release/coat/dry techniques.

Certain embodiments of the present invention employ a thin dielectric film, which may (e.g., SU-8) or may not be photoimageable (e.g., parylene). This dielectric material substantially conforms to the contour of wires or other interconnects, and provides an opportunity to shield signal and power lines by subsequently overcoating with a conductive metallic coating.

Use of a protective coating covering the passive area, but not covering the active area, reduces concerns about what materials are used in "package first, release later" packaging schemes, because release etchant (s) never comes in contact with these materials. It effectively renders all materials immune to release etch(s).

Objects, advantages and novel features, and further scope of applicability of the present invention will be set forth in part in the detailed description to follow, taken in conjunction with the accompanying drawings, and in part will become apparent to those skilled in the art upon examination of the following, or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated into and form a part of the specification, illustrate one or more embodiments of the present invention and, together with the description, serve to explain the principles of the invention. The drawings are only for the purpose of illustrating one or more preferred embodiments of the invention and are not to be construed as limiting the invention. In the drawings.

DETAILED DESCRIPTION OF THE INVENTION

Figure 1A:
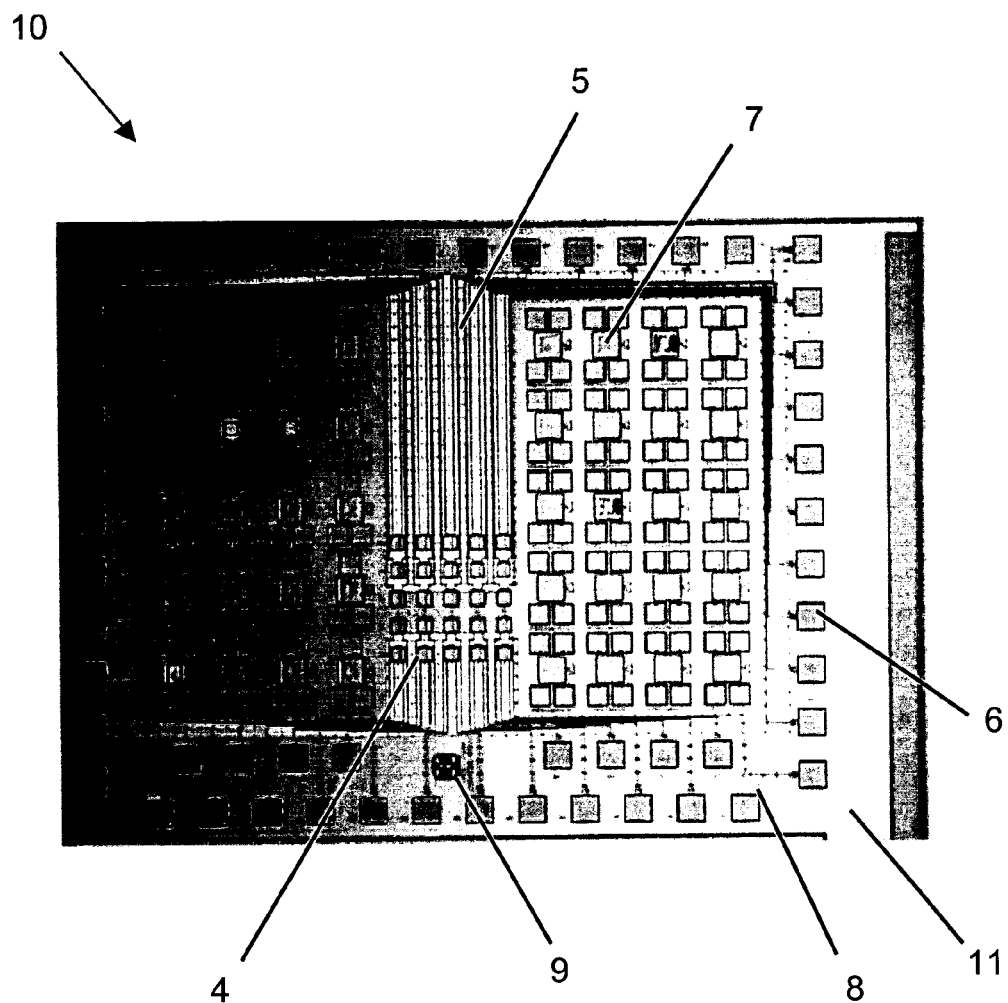
FIG. 1a shows a photomicrograph of a plan view of a fabricated microelectronic device comprising a silicon die with a 5×5 array of active MEMS elements (micromirrors), and routing lines connecting the mirrors to bond pads.

The present invention relates to methods to protect a MEMS or microsensor device through one or more release or activation steps in a "package first, release later" manufacturing scheme. This method of fabrication permits wirebonds, other interconnects, packaging materials, lines, bond pads, and other structures on the die to be protected from physical, chemical, or electrical damage during the release etch(es) or other packaging steps. Metallic structures (e.g., gold, aluminum, copper) on the device are also protected from galvanic attack because they are protected from contact with HF or HCL acid etch solutions.

Definitions

Herein, the word "wafer" is defined to include not only silicon, but also germanium, gallium arsenide (GaAs), other semiconducting materials, and also quartz wafers or substrates (e.g., for MEMS structures), and silicon on insulator (SOI). Substrates such as alumina, LTCC, HTCC, and polymer are also included. Use of the word "MEMS" is intended to also include "IMEMS" devices, unless specifically stated otherwise. Likewise, the word "plastic" is intended to include any type of flowable dielectric composition. The word "film" is used interchangeably with "coating", unless otherwise stated. The phrases "released", "released MEMS elements", "released MEMS structures", "active MEMS elements", "activated microsensor elements", and "activated" are used interchangeably to refer to freely-movable structural elements, such as gears, pivots, hinges, sliders, valves, etc.; and also to functionally active microsensing/microsensor elements (e.g., flexible membranes, exposed electrodes, chemically-sensitive films) that are exposed to the ambient environment for microsensors (e.g., chemical, pressure, and temperature microsensors); and also to optically-active elements (e.g., CCD elements) that may or may not be optically-accessible through a transparent window. The verbs "release/releasing" and "activate/activating" are used interchangeably herein, and mean removing any sacrificial or protective coating from MEMS elements to make them free, and/or removing any sacrificial or protective coating from microsensing elements to make them functional by allowing them to be exposed to the ambient environment, either directly exposed, or optically-exposed through a transparent window (in the case of optically-active elements). Examples of optically-active devices include charge coupled devices (CCD), IR detectors, photocells, laser diodes, vertical cavity surface emitting lasers (VCSEL's), and UV erasable programmable read-only memory chips (UV-EPROM' s). While some of these devices emit light, and while others receive light, or both, they are all considered to be "optically active".

Herein, the phrases "active area", "activated area", "released area", and "sensitive area"," means one or more locations on a microelectronic device, such as on a silicon wafer or die, where MEMS and/or microsensing elements are located (either in the released or unreleased state, and/or in the activated or unactivated state).

The phrases "non-active area" and "passive area", mean one or more locations on the device where the MEMS and/or microsensing elements mentioned above are not located. However, the use of the phrases "non-active area" and "passive area" does not mean or imply that these areas cannot have electrically-active elements, such as conductors, resistors, capacitors, inductors, IC's, etc., or other active elements (such as optically-active fiber optics, or chemically-active fluidic channels, etc.)

The verb "etching" means both wet and dry etching, plasma etching, reactive ion etching (RIE), dissolving, removing, sublimating, or other material removal techniques well know in the art. The word "etchant" means a liquid, gas, plasma, or combination thereof, that can remove material, including: wet solutions containing one or more acids, reactive plasma, water, reactive gas(es), or combinations thereof.

The word "substrate" includes both electrically insulating materials, semiconducting materials with doped layers, and electrically conducting materials with one or more insulating coatings or layers. The word "substrate" includes insulating packages, standardized insulating packages (e.g., DIP, Quad FlatPack, etc.), and insulating interposers (comprising thin plates, with or without apertures, that are used to provide a fanned-out pattern of conductive traces transitioning from a fine pitch to a coarse pitch). Interposers are more typically used in flip-chip packaging, than wirebonded packages; and an interposer can also be used as a package lid.

DETAILED DESCRIPTION

In one embodiment of the present invention, part of the method comprises preparing a MEMS die by exposing bond pads as necessary, while leaving one or more active areas where MEMS structures are located unreleased.

In another embodiment of the present invention, part of the method comprises preparing a MEMS die by the following steps: (1) providing a wafer with unreleased (e.g., glass-coated) MEMS elements, (2) releasing the MEMS elements at the wafer scale by wet acid etching away the glass coating, (3) applying a temporary sacrificial coating of parylene or other dry-etchable, conformal coating to the wafer, thereby immobilizing and protecting the MEMS elements a second time (i.e., made "unreleased" again), (4) dicing the wafer into individual dies, and (5) exposing bond pads. Alternatively, step (5) could be performed before the wafer is diced in step (4). Additional details of this process can be found in U.S. Pat. No. 6,335,224 to Peterson, et al., which is incorporated herein by reference.

FIG. 1a shows a photomicrograph of a plan view of a first microelectronic device 10 comprising a silicon die 11 with a 5×5 array of released, active MEMS elements 4 (micromirrors), and routing lines 5 connecting the micromirrors 4 to bond pads 6. Device 10 also contains non-moving features, such as routing lines 5, bond pads 6, test structures (mirrors) 7, alignment marks 8, and logo 9.

Figure 1B:
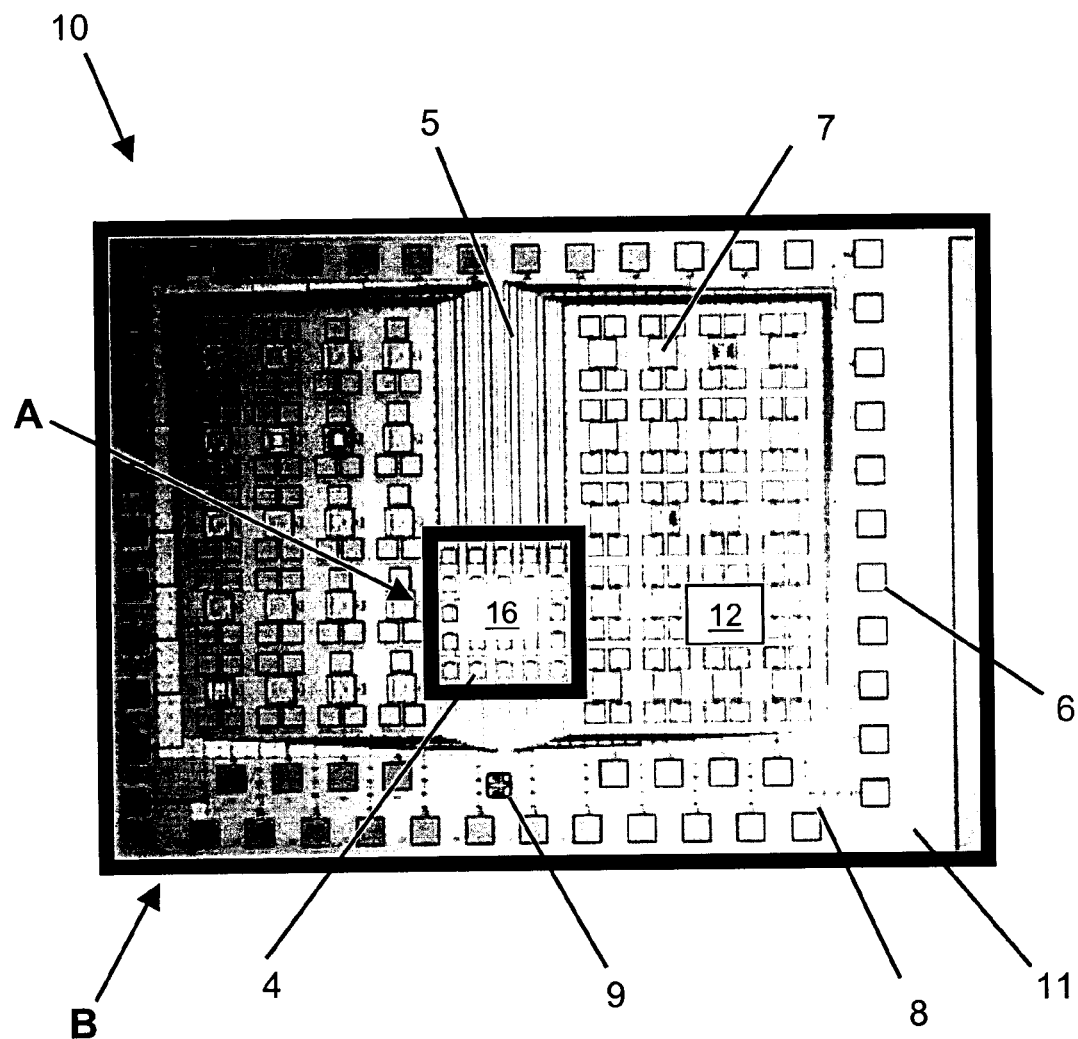
FIG. 1b shows a photomicrograph of a plan view of the microelectronic device shown in FIG. 1a, showing the active and passive areas of the device, according to the present invention.

FIG. 1b shows a photomicrograph of a plan view of the first microelectronic device 10, with borders superimposed indicating the active and passive areas of the device, according to the present invention. The area inside the inner box "A" is designated the "active" area 16, which contains the 5×5 array of released, active MEMS micromirrors 4. The area outside of box "A", but inside of box "B" is designated the "passive" area 12, which contains non-moving, passive features, such as routing lines 5, bond pads 6, thin-film resistors 7, alignment marks 8, and logo 9.

Figure 1C:
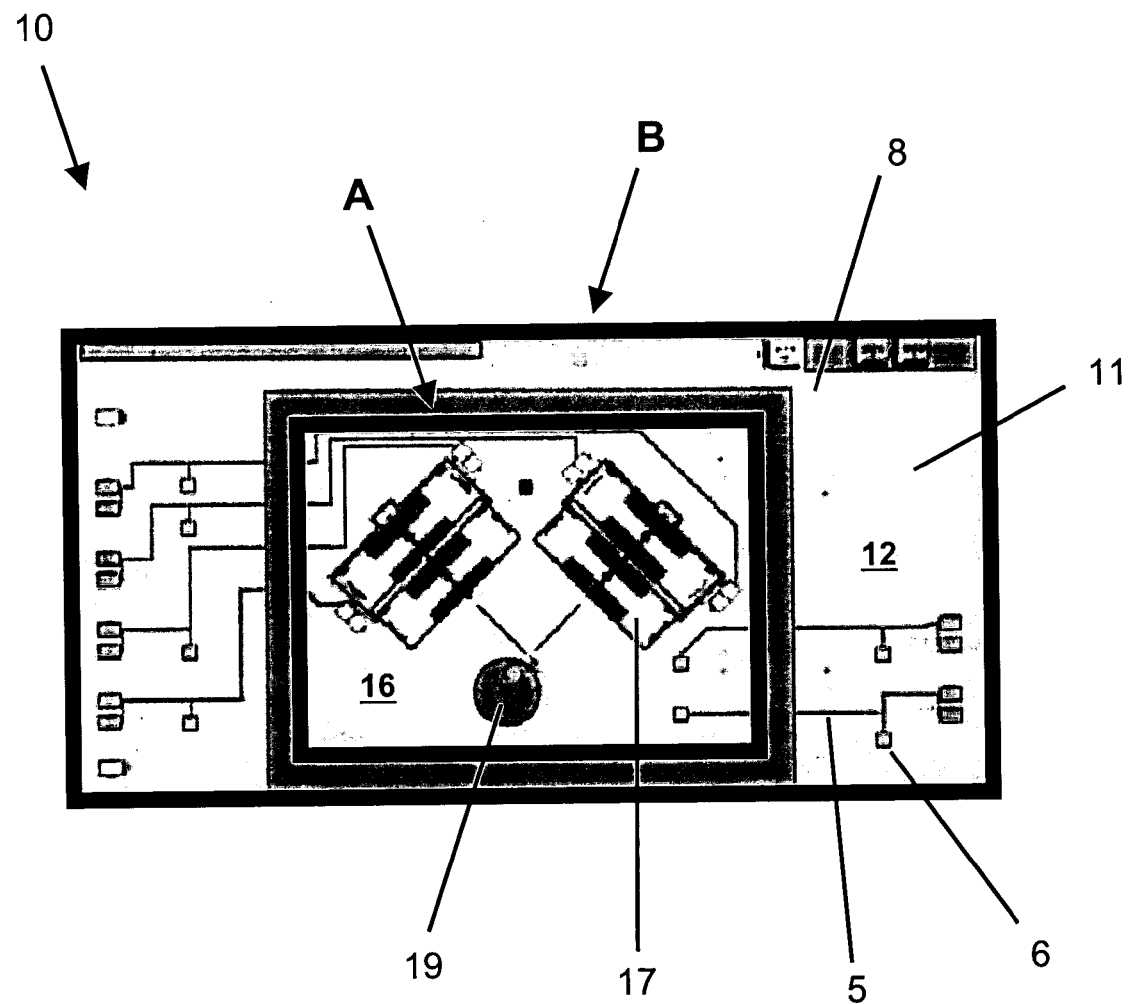
FIG. 1c shows a photomicrograph of a plan view of another fabricated microelectronic device comprising a silicon die with a pair of electrostatic linear MEMS drivers actuating a MEMS gear, and routing lines connecting the linear drivers to bond pads.

FIG. 1c shows a photomicrograph of a plan view of a second MEMS device 10 comprising a silicon die 11 with a pair of electrostatic linear MEMS drivers 17 driving a rotating MEMS gear 19, and routing lines (i.e., traces) 5 connecting the linear drivers to bond pads 6. Active area 16 inside of box "A" contains a pair of electrostatic linear MEMS drivers 17 and MEMS gear 19. Passive area 12 (outside of box "A" and inside of box "B") contains routing lines 5, bond pads 6, and alignment marks 8.

FIGS. 2a–2e illustrate a first example of a series of steps for fabricating a microelectronic device, according to the present invention.

Figure 2A:
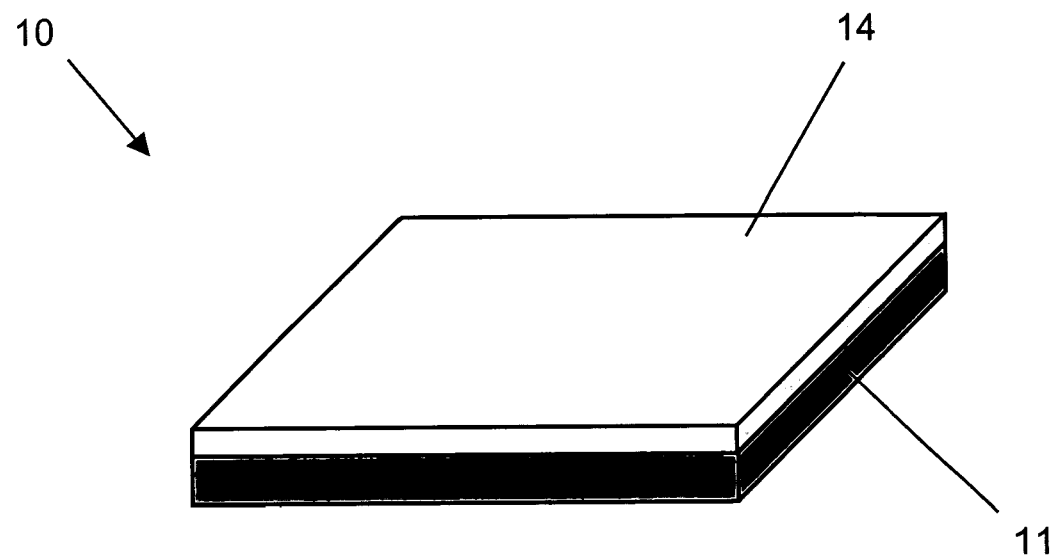
FIGS. 2a–2e show schematic isometric views of a first example of a microelectronic device, according to the present invention.

In FIG. 2a, a microelectronic device 10 with unreleased MEMS elements (hidden) and bond pads (hidden) encapsulated in a sacrificial coating 14 disposed on a silicon die 11 is provided. Sacrificial coating 14 can comprise, for example, glass, silicate glass, silicon nitride, or a vapor-deposited, conformal coating (e.g., parylene).

Examples of microelectronic device 10 include an airbag accelerometer, a microengine, an optical switch, a gyroscopic device, a microsensor, and a microactuator. Microelectronic device 10 can include microelectromechanical systems (MEMS) that have MEMS elements (e.g., gears, hinges, levers, slides, and mirrors). These freestanding MEMS elements must be free to move, rotate, etc during MEMS operation. Microelectronic device 10 can also include IMEMS devices, which combine integrated circuits (IC's), such as CMOS or Bipolar circuits, with MEMS devices on a single substrate, such as a multi-chip module (MCM). Microelectronics device 10 can also include microsensors, which must be freely exposed to the environment during operation (e.g., for chemical, pressure, or temperature measurements). Microelectronics device 10 can also include microfluidic systems, such as used in Chemical-Lab-on-a-Chip systems.

Figure 2B:
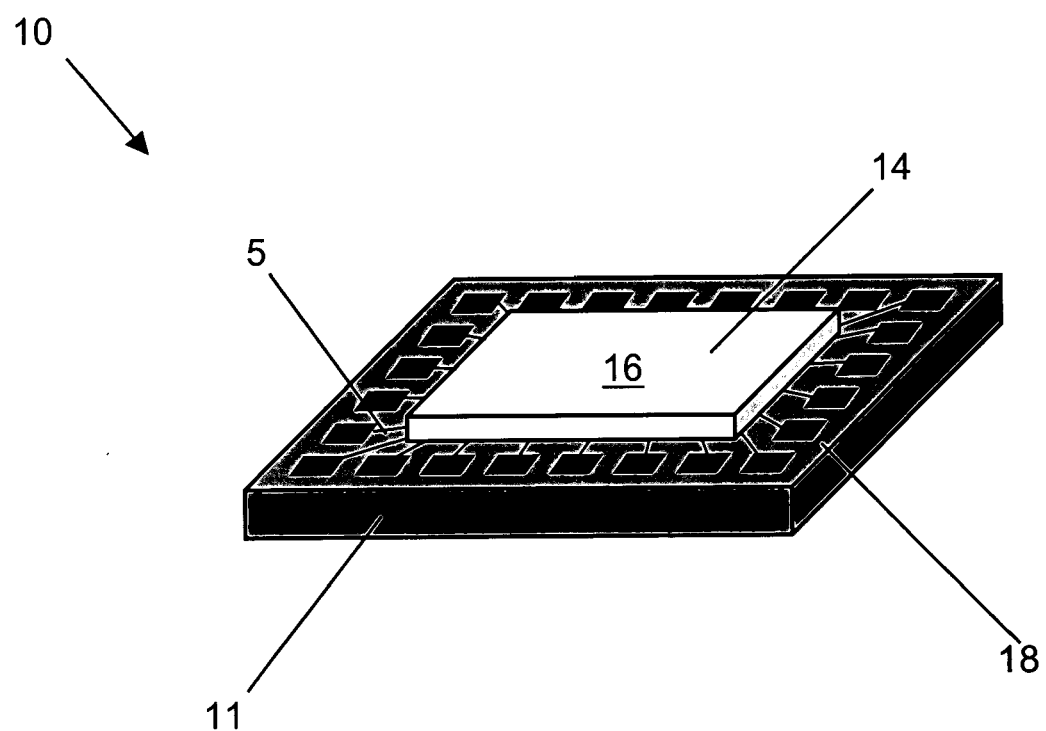

Next, in FIG. 2b, bond pads 18 and traces 5 are exposed by removing the sacrificial encapsulant 14 covering the pads and traces, to permit subsequent electrical interconnection. Active area 16 contains the unreleased MEMS elements (hidden) encapsulated in sacrificial coating 14. Passive area 12 surrounds the outer perimeter of active area 16 and includes the exposed bond pads 18, among other things. Note that the fabrication steps that will be described in a later section with regard to FIGS. 14a–14d, can be viewed as one example of the steps that one might use to proceed from FIG. 2a to FIG. 2b.

Figure 2C:
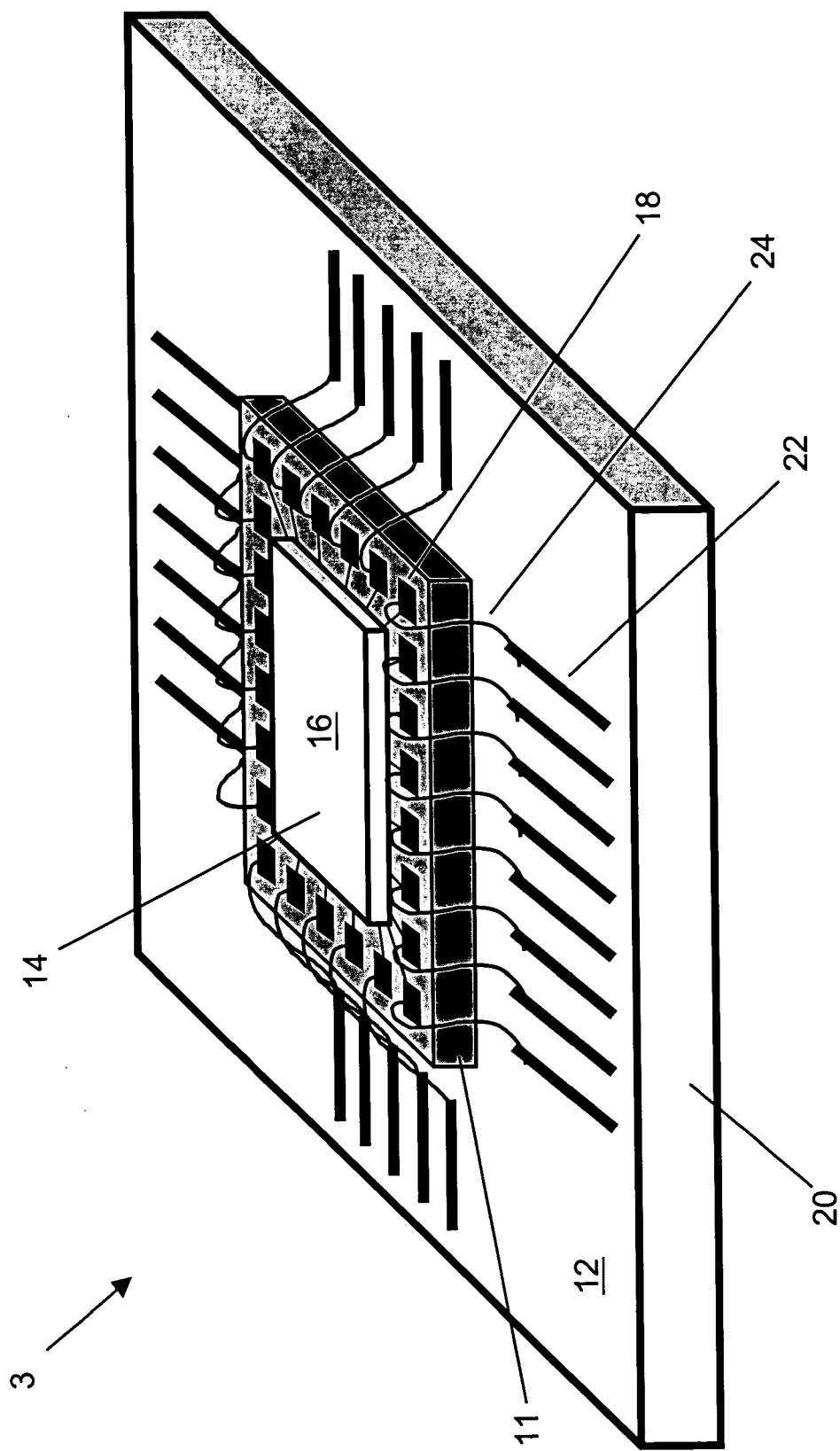

Next, in FIG. 2c, silicon die 11 is die-attached to substrate 20, which can be an electrically insulating material, and then wirebond interconnections 24 are made between bond pads 18 and conductive lines 22 disposed on substrate 20. Passive area 12 includes wirebonded interconnections 24 and conductive lines 22, in addition to bond pads 18.

Figure 2D:
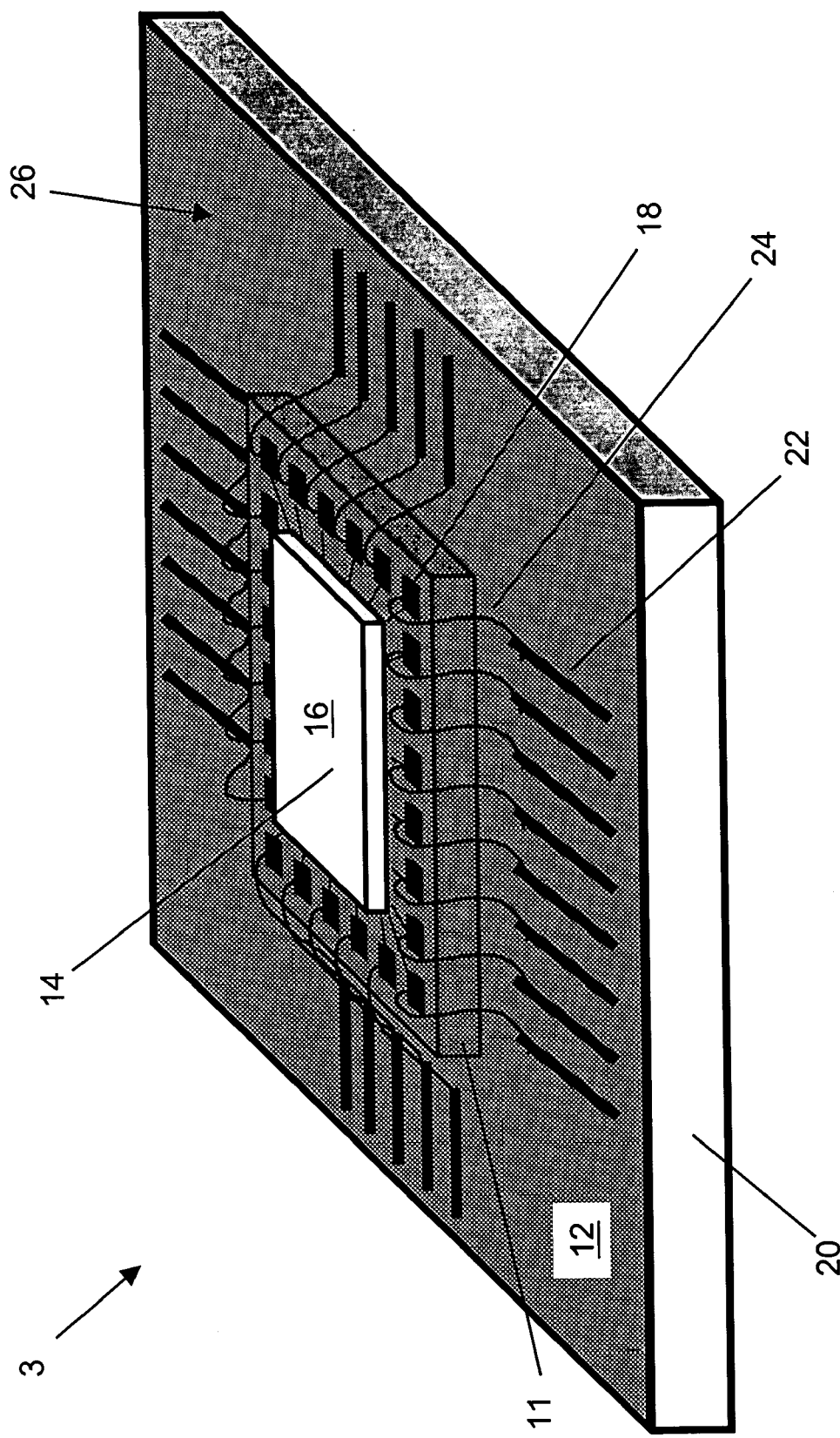

Next, in FIG. 2d, passive area 12 is covered by an electrically insulating, protective coating 26. However, protective coating 26 is not applied to active area 16 in this embodiment. Protective coating 26 may be thin.

Figure 2E:
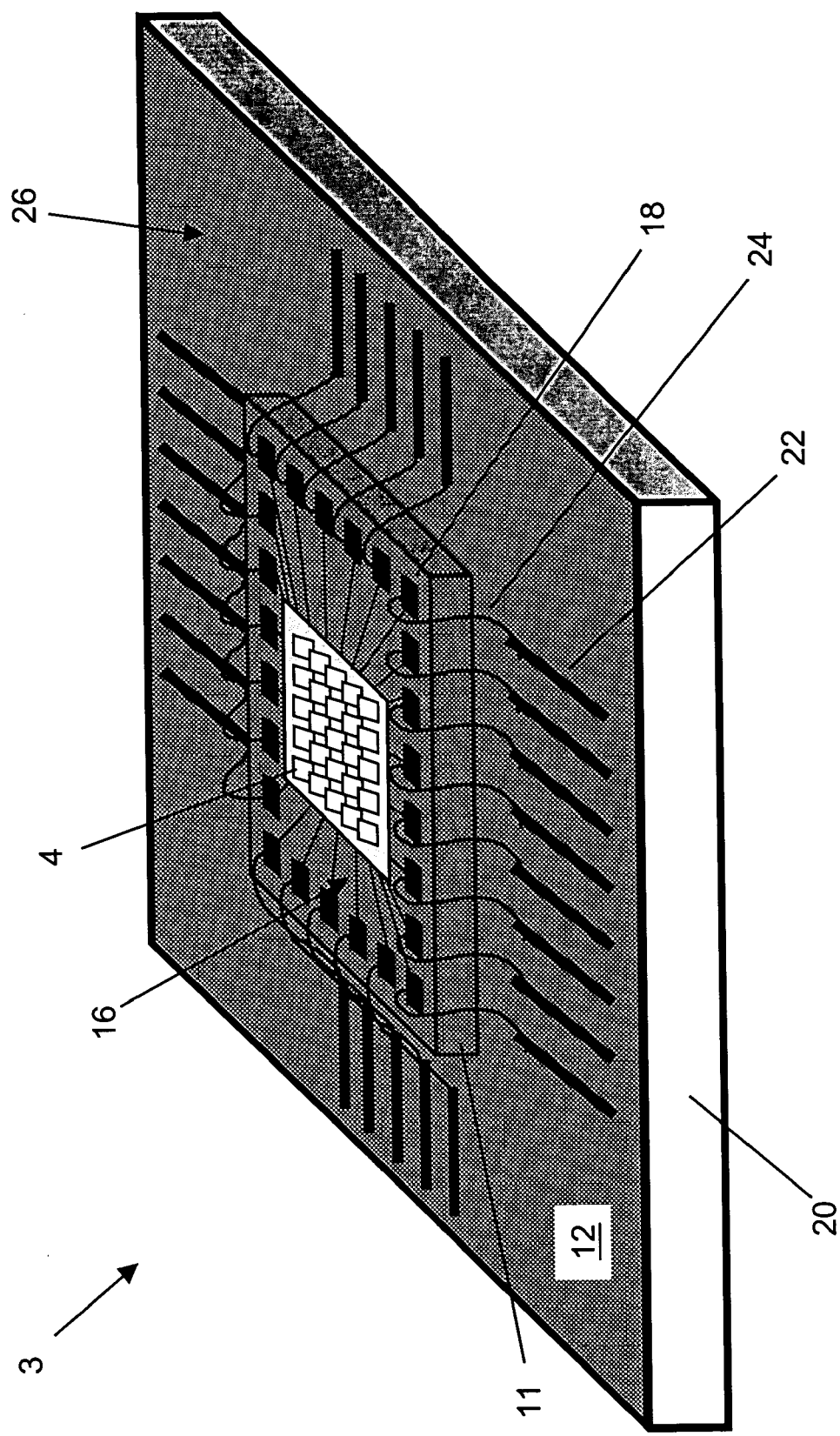

Finally, in FIG. 2e, the MEMS elements 4 (i.e., 5×5 array of micromirrors) located inside of active area 16 are released and made functional (i.e., movable) by removing sacrificial coating 14 (i.e., by wet acid etching), while not removing protective coating 26 from passive area 12. This can be achieved, for example, by using a protective coating 26 that is resistant to dissolution by a wet acid etchant. After release, MEMS elements 4 can be coated with an anti-stiction coating, and then dried.

A wide range of interconnection techniques, including wirebonding with a variety of materials (e.g., Al, Au, and Cu), thermocompression bonding, and flip chip using a variety of materials (e.g., gold, gold-silicon, solders, and polymers), may be used. A wide range of die attach techniques (e.g., Au—Si eutectic die attach, adhesive die attach, conductive polymer die attach, solder die attach) and packaging materials (e.g., ceramic, plastic, pwb, multilayered material, LTCC, HTCC) and package designs (e.g., DIP, ceramic DIP, CERDIP, plastic quad flatpack, leadless chip carrier, leaded flatpack, etc.) may be used. In certain embodiments the thickness of protective coating 26 may be less than 500 microns. In other embodiments the thickness of protective coating 26 may be less than 100 microns. Alternatively, in other embodiments the thickness of protective coating 26 may be less than 100 angstroms.

Certain embodiments of the present invention may use a range of protective coatings as thin encapsulants, including Parylene, SU-8, sputtered films, sprayed materials, and globbed or dabbed or dispensed materials (i.e., "goo" refers to a material that dries or cures). The thin, electrically-insulating, protective coating can be selected from: a vapor-deposited coating, a vacuum vapor deposited coating, a chemical vapor deposited coating, a water-insoluble coating, a water-soluble coating, a dry-etchable coating, a conformal coating, a pin-hole free coating, parylene, a photopatternable/photoimagable material, photoresist, low viscosity photoresist, an epoxy based negative photoresist, SU-8, SU-8 2000, sputtered coating, an evaporated coating, a ceramic coating, silicon nitride, aluminum oxide, mullite), sprayed coating, a self-assembled monolayered material, cyanoacrylate, perfluoropolyether, hexamethyldisilazane, perfluorodecanoic carboxylic acid, silicon dioxide, TEOS, silicate glass, fast-etch glass, silicon, polysilicon. Some of these coating materials resist attack by acids (e.g., HF, HCL) used in wet release steps.

In other embodiments of the present invention, protective coating 26 may comprise a water-insoluble, vacuum vapor-deposited, strong, pure, inert, defect-free, dry-etchable, and conformal. Coatings made from parylene generally have these useful properties.

An example of a suitable protective coating is a material chosen from the family of vacuum vapor-deposited (e.g., CVD or PECVD) materials generically called "parylene". Other polymer coatings could be used, for example: epoxies, acrylics, urethanes, and silicones. However, those other coatings are generally applied in the liquid state, whereas parylene is applied in the vapor-phase. Liquid coatings generally do not conform as well to the complex 3-D shaped, multi-layer MEMS elements as vacuum vapor-deposited conformal coatings, such as parylene, especially when the viscosity of the liquid coating is high. Also, liquid coatings can have problems with wire sweep and shear, as discussed earlier.

"Parylene" is the generic name for members of a unique polymer series originally developed by the Union Carbide Corporation. The basic member of the series is poly-para-xylylene, a completely linear, highly crystalline material called Parylene N. Parylene N is a primary dielectric, exhibiting a very low dissipation factor, high dielectric strength, and a dielectric constant invariant with frequency. Parylene C, the second commercially available member of the Union Carbide series, is produced from the same monomer, which has been modified by the substitution of a chlorine atom for one of the aromatic hydrogens. Parylene C has passed the NASA Goddard Space Flight Center outgassing test. Parylene C has a useful combination of electrical and physical properties plus a very low permeability to moisture and other corrosive gases. It also has the ability to provide a pinhole-free, conformal insulation. For these reasons, Parylene C is a useful material for coating critical electronic assemblies.

Parylene D, the third member of the Union Carbide series, is produced from the same monomer, but modified by the substitution of the chlorine atom for two of the aromatic hydrogens. Parylene D has similar properties to Parylene C, but has the ability to withstand higher use temperatures. Due to the uniqueness of the vapor phase deposition, the parylene family of polymers can be formed as structurally continuous films as thin as a fraction of a micrometer, to as thick as several thousandths of an inch.

Vacuum vapor-deposited parylene coatings can be applied to specimens in an evacuated deposition chamber by means of gas phase polymerization. The parylene raw material, di-para-xylylene dimer, is a white crystalline powder manufactured by Union Carbide Corporation, Danbury, Conn. under the product name "Parylene Dimer DPX-N". First, the powder is vaporized at approximately 150 degrees C. Then it is molecularly cleaved (e.g., pyrolyzed) in a second process at about 680 degrees C. to form the diradical, para-xylylene, which is then introduced as a monomeric gas that polymerizes on the specimens in the vacuum chamber at room temperature. There is no liquid phase in the deposition process, and specimen temperatures can remain near ambient. The coating grows as a pure, defect-free, self-assembling, conformal film on all exposed surfaces, edges, and crevices.

During the deposition stage, the active (cured) monomeric gas polymerizes spontaneously on the surface of coated specimen at ambient temperature with no stresses induced initially or subsequently. In short, there are no cure-related hydraulic or liquid surface tension forces in the process. Parylene coatings can be formed at a vacuum of approximately 0.1 torr, and under these conditions the mean-free-path of the gas molecules in the deposition chamber is in the order of 0.1 cm. In the free molecular dispersion of the vacuum environment, all sides of an object to be coated are uniformly impinged by the gaseous monomer, resulting in a high degree of conformity. Polymerization occurs in crevices, under devices, and on exposed surfaces at about the same rate of about 0.2 microns per minute for Parylene C, and a somewhat slower rate for parylene N. However, the deposition rate depends strongly on processing conditions.

Parylene coatings possess useful dielectric and barrier properties per unit thickness, as well as extreme chemical inertness and freedom from pinholes. Since parylene is non-liquid, it does not pool, bridge, or exhibit meniscus or capillary properties during application. No catalysts or solvents are involved, and no foreign substances are introduced that could contaminate coated specimens. Parylene thickness is related to the amount of vaporized dimer and dwell time in the vacuum chamber, and can be controlled accurately to +/−5% of final thickness. The vacuum deposition process makes parylene coating relatively simple to control, as opposed to liquid materials, where the thickness and evenness are more difficult to control. Parylene films/coatings meet typical printed wiring assembly coating protection and electrical insulating standards; as specified by MIL-I-46058. The coating's thickness is controllable from as little as 100 Angstroms, to hundreds of microns.

The parylene polymer coatings have fairly good adhesion to epoxy molding compounds. Interestingly, parylene monomer is soluble in epoxy gel-coat. Parylene polymer coatings in contact with the surface of an epoxy layer can result in an interpenetrating polymer network and an especially effective mechanism for adhesion, if required.

Curing of parylene coatings occurs during deposition; therefore no high temperature curing step is required (e.g., after deposition). Since parylene is applied in a non-liquid state, there are no hydrodynamic forces that could damage any fragile, released MEMS elements. Deposition generally takes place at ambient temperatures, which minimize thermal or chemical cure stresses. Parylene's static and dynamic coefficients of friction are in the range of 0.25 to 0.33 (in air), which makes this coating only slightly less lubricious than TEFLON®. Because the parylene deposition process is spontaneous, and does not require a cure catalyst, it is therefore extremely pure and chemically inert.

Parylene polymers generally resist chemical attack and are insoluble in all organic solvents up to 150 degrees C., including water. Parylene C can be dissolved in chloro-naphthalene solvent at 175 degrees C., and Parylene N is soluble at the solvent's boiling point of 265 degrees C. In particular, parylene coatings are resistant to attack by acid solutions used in wet release etchants (e.g., HF, HCL). Parylene coatings can be removed by many processes, including oxygen or ozone reactive ion plasma exposure; laser ablation, and mechanical removal (scratching, scuffing, cutting, slicing, etc.). Oxygen-based plasma exposure does not harm polysilicon structural elements of MEMS devices. Also, dry etching of parylene coatings is generally faster than dry etching of silicon dioxide glass coatings.

Reactive parylene monomers can be blended with other reactive materials, including silicon, carbon, and fluorine containing monomers (including siloxanes), to form copolymer compounds, Additional information on the formation and composition of thin parylene films on semiconductor substrates for use as a low-dielectric, insulating coating is contained in U.S. Pat. No. 5,958,510 to Sivaramakrishnam, et al., and in U.S. Pat. No. 6,030,706, to Eissa, et al., both of which are incorporated herein by reference.

Figure 3A:
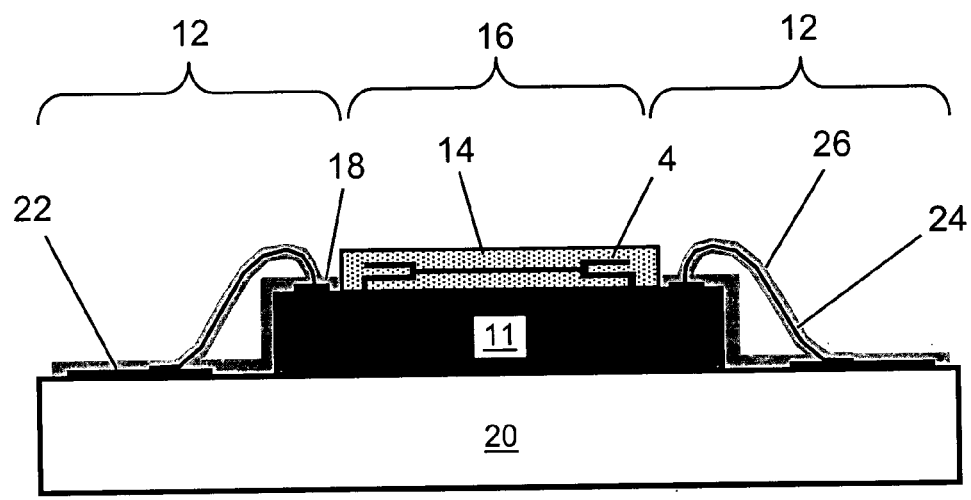
FIGS. 3a–3b show schematic cross-section views of a second example of a microelectronic device, according to the present invention.
Figure 3B:
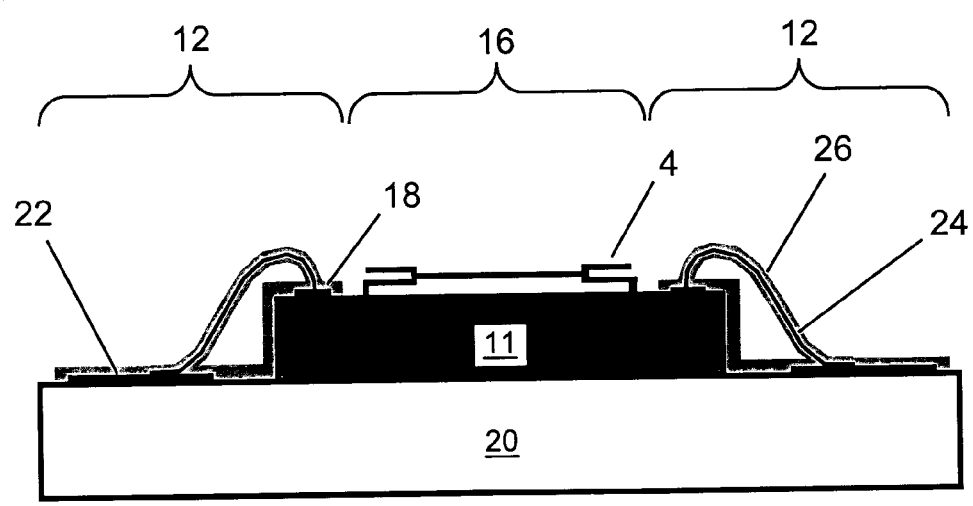

FIGS. 3a–3b illustrate a second example of a series of steps for fabricating a microelectronic device, according to the present invention.

First, in FIG. 3a, an assembly 3 is provided comprising a silicon die 11 die-attached to an electrically insulating substrate 20, with wirebonded interconnections 24 made between bond pads 18 located on die 11 and conductive lines 22 located on package 20. Substrate 20 may comprise, for example, a ceramic, a plastic, a printed wiring board (pwb) material, a polymer, a multi-layered material, a LTCC ceramic multilayered material, or a HTCC ceramic multilayered material. Unreleased MEMS elements 4, encased in sacrificial material 14, are disposed on silicon die 11. Assembly 3 further comprises a thin, electrically insulating protective coating 26 that covers passive area 12, but not active area 16.

Then, in FIG. 3b, MEMS elements 4 are released using a technique that selectively removes sacrificial material 14, but does not remove protective coating 26 from passive area 12. After being released, MEMS elements 4 may be coated with an anti-stiction coating and then dried.

FIGS. 4a–4f illustrate a third example of a series of steps for packaging a microelectronic device in a "package first, release later" scheme, according to the present invention.

Figure 4A:
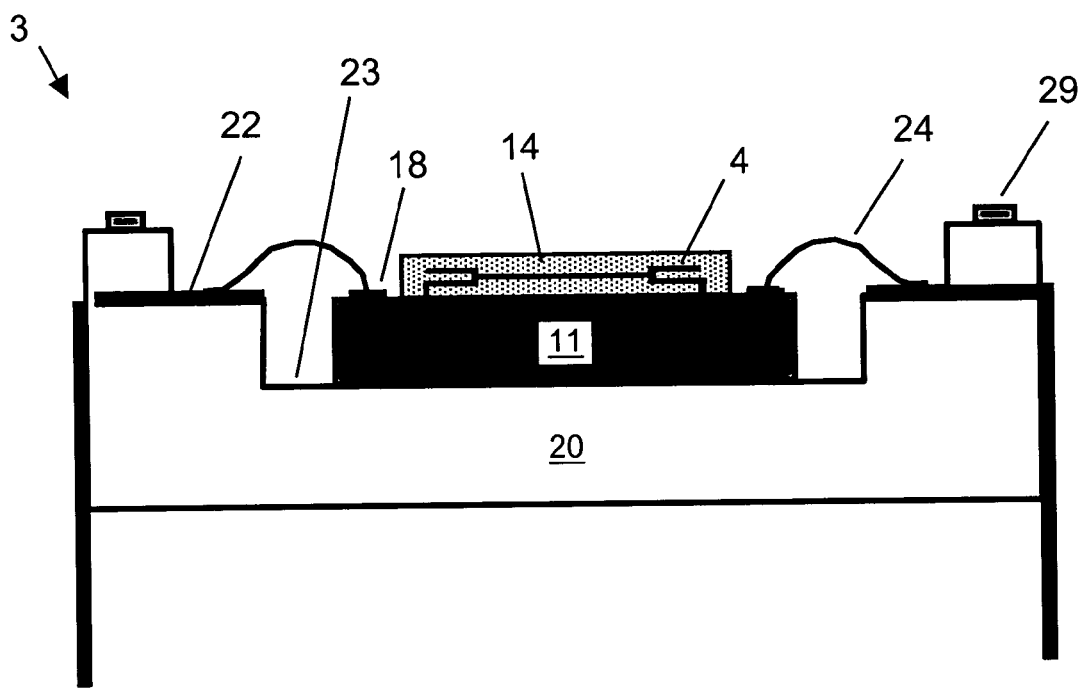
FIGS. 4a–4f show schematic cross-section views of a third example of a microelectronic device, according to the present invention.

First, in FIG. 4a, an intermediate assembly 3 is provided comprising a silicon die 11 die-attached to the floor 23 of package 20, with wirebonded interconnections 24 made between bond pads 18 located on die 11 and conductive lines 22 located on package 20. Package 20 may comprise a ceramic package, such as the CERDIP package illustrated in this Figure, which may be made of a LTCC or a HTCC ceramic multilayered material. Unreleased MEMS elements 4, encased in sacrificial material 14, are disposed on silicon die 11. Ring seal 29 is disposed on the upper surface of package 20.

Figure 4B:
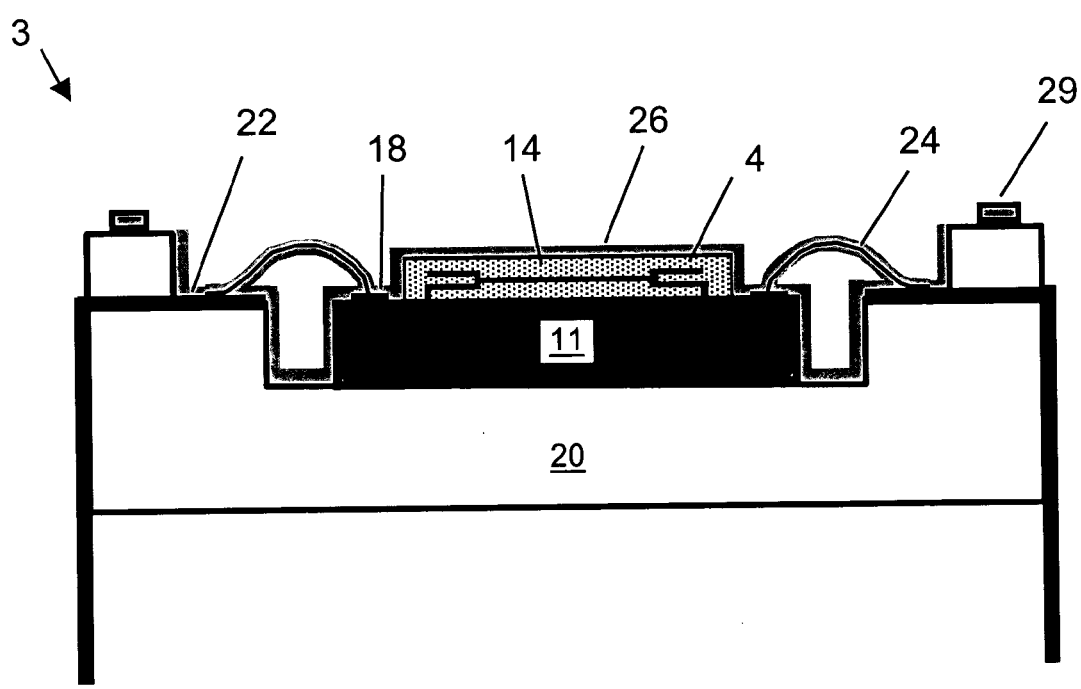

Next, in FIG. 4b, a thin, electrically insulating protective coating 26 is applied to both the active and passive areas of assembly 3, including wirebonds 24, and to the interior surfaces of package 20, but not to the ring seal 29.

Figure 4C:
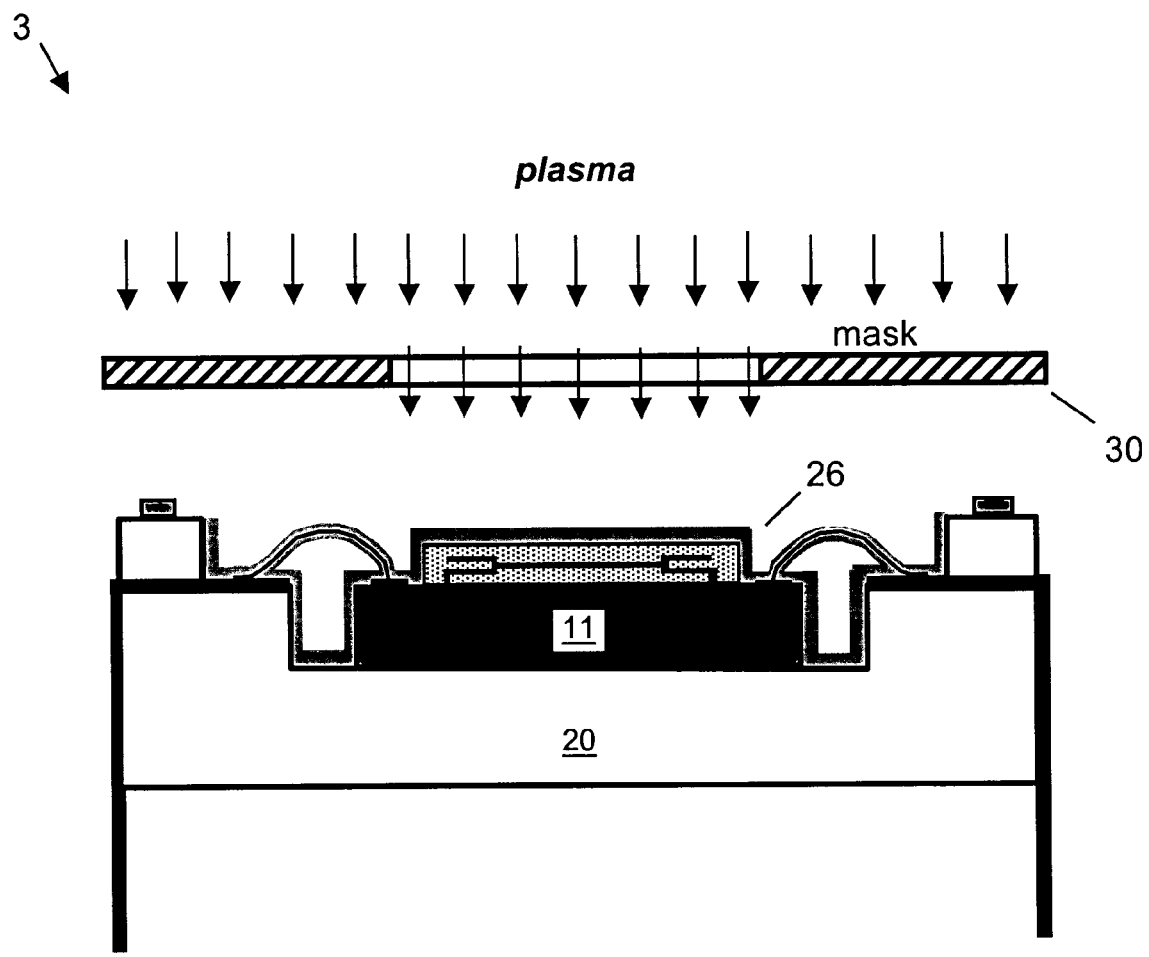

Next, in FIG. 4c, a mask 30 is provided that covers the passive area, but not the active area. Then, assembly 3 is exposed to a plasma etch (e.g., oxygen-bearing plasma) that streams through an opening in mask 30 aligned with the active area; thereby removing only that portion of protective coating 26 which covered the active area. Mask 30 prevents the plasma etch from removing the protective coating 26 from the passive area.

Figure 4D:
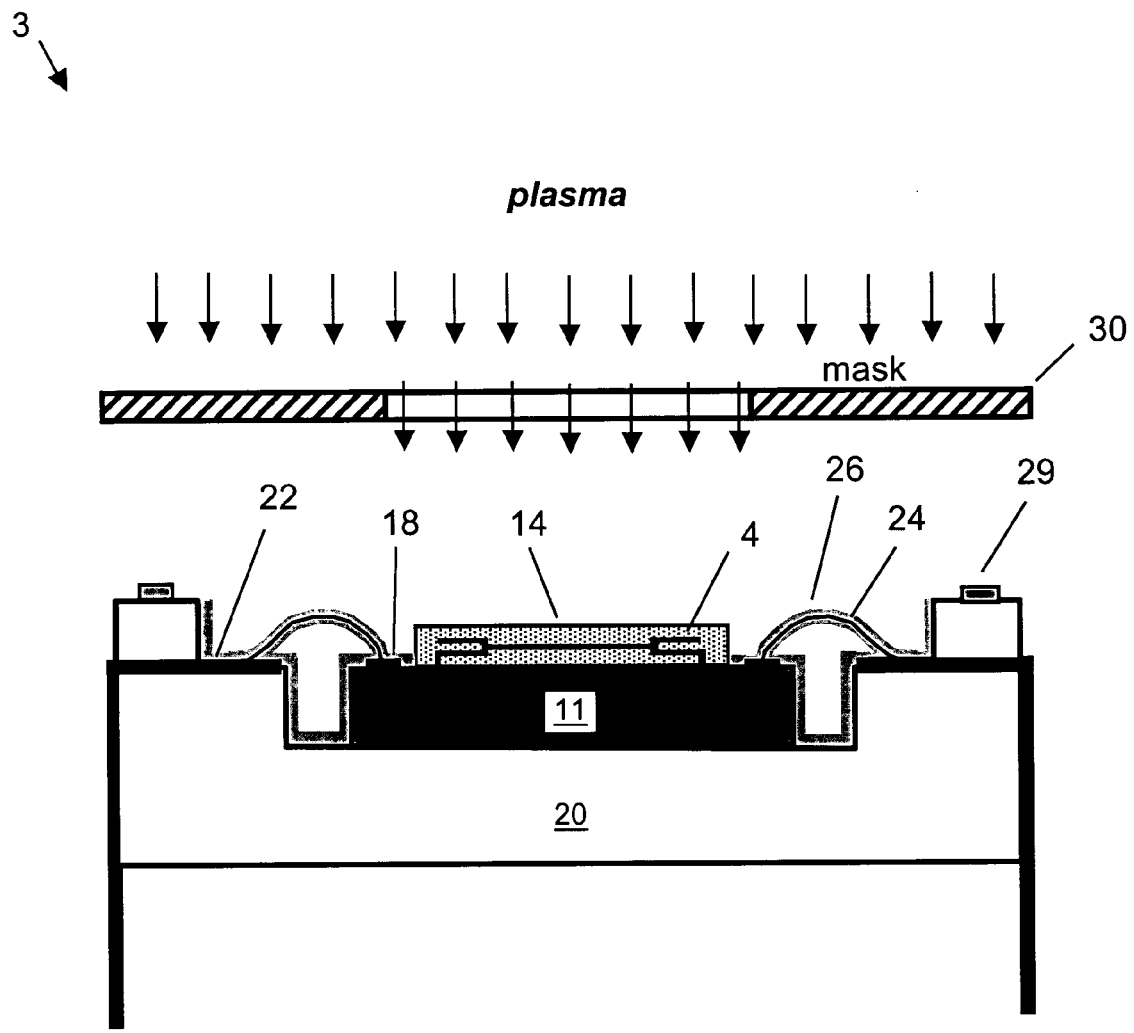

In those embodiments where the protective coating 26 comprises a material that is dissolvable by HF or HCL acids, and is etchable by a dry plasma, both that part of the protective coating 26 covering the active area and the underlying sacrificial coating 14 can be removed in a single, continuous step by exposing assembly 3 to a masked plasma etchant. This option is shown in FIG. 4d, where the same plasma etch that was previously used in FIG. 4c is now removing coating 14 (i.e.). As before, mask 30 prevents/occludes the plasma etch from removing the protective coating 26 from the passive area. In this case, no wet acid etches/solutions need to be used in any of the packaging steps, thereby eliminating any potential problems with acid attack of packaging materials, electrical interconnects, other structures, etc.

In an alternative embodiment, where the protective coating 26 is resistant to dissolution by acid solutions (e.g., containing HF or HCL), the exposed sacrificial coating 14 shown in FIG. 4d may be removed by a wet acid etch, which is generally a faster process then plasma etching. Acid etching can comprise immersing the entire assembly 3, without any masking, in a bath or spray of the acid etchant solution, since the protective coating 26 will not be substantially removed from the passive area. While some dissolution of protective coating 26 may occur during wet acid etching, this may be acceptable so long as the entire thickness of coating 26 is not removed.

Figure 4E:
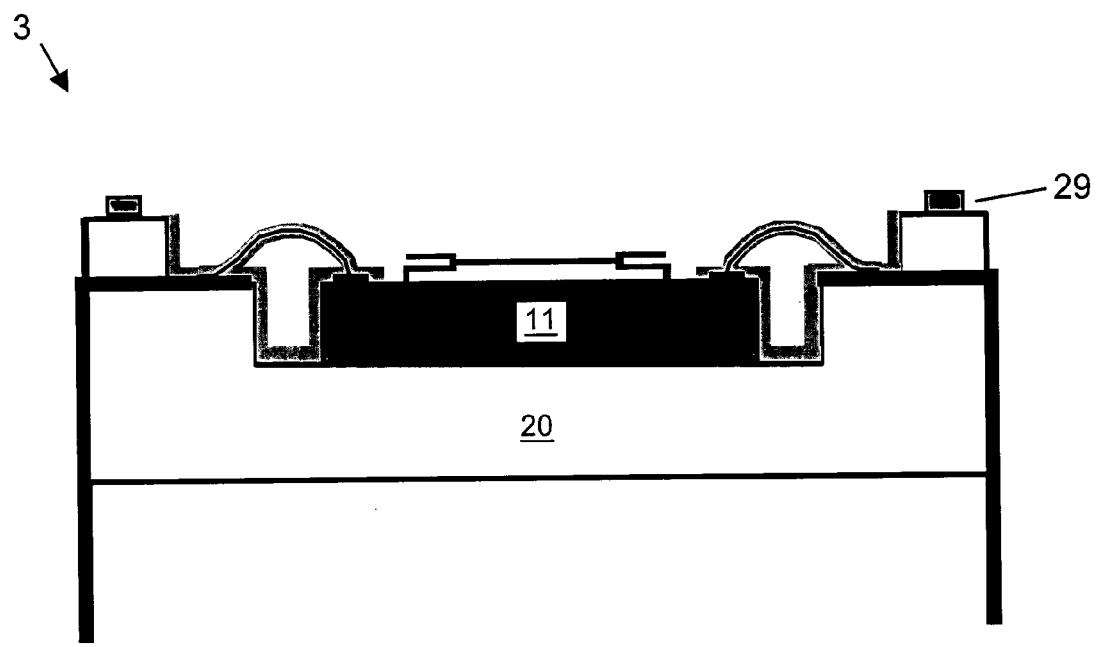

FIG. 4e shows the released MEMS elements 4, after being coated with an optional anti-stick coating and dried.

Figure 4F:
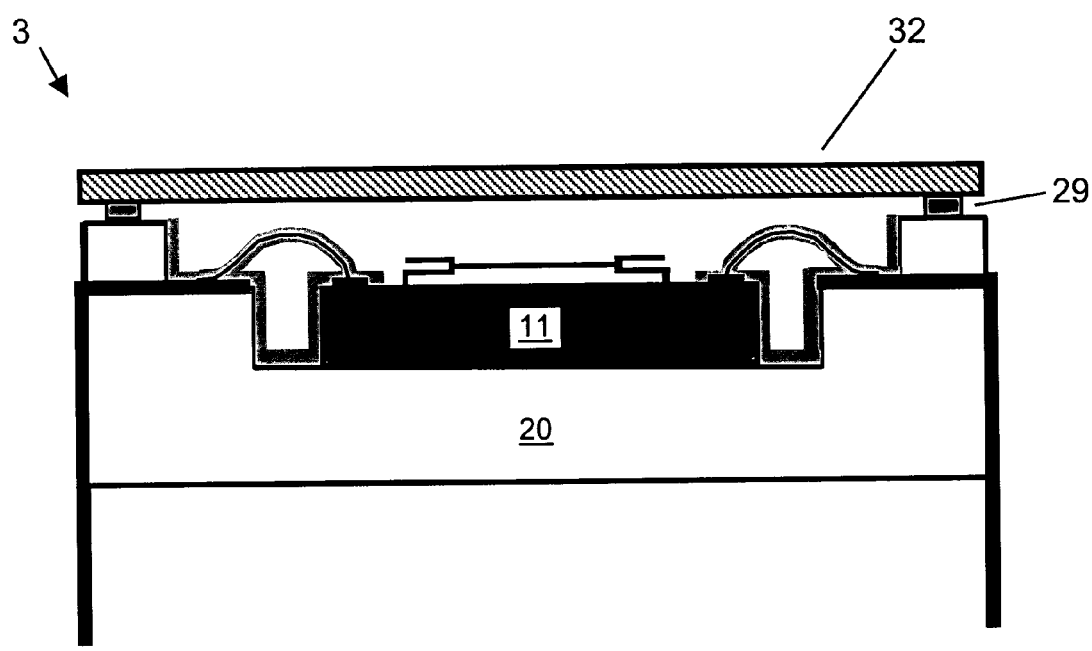

Finally, in FIG. 4f, a cover lid 32 is attached to the upper surface of package 20 using ring seal 29. Cover lid 32 may be opaque or transparent. Alternatively, cover lid may comprise a transparent window mounted inside of an frame.

FIGS. 5a–5f illustrate a fourth example of a series of steps for packaging a microelectronic device in a "package first, release later" scheme.

Figure 5A:
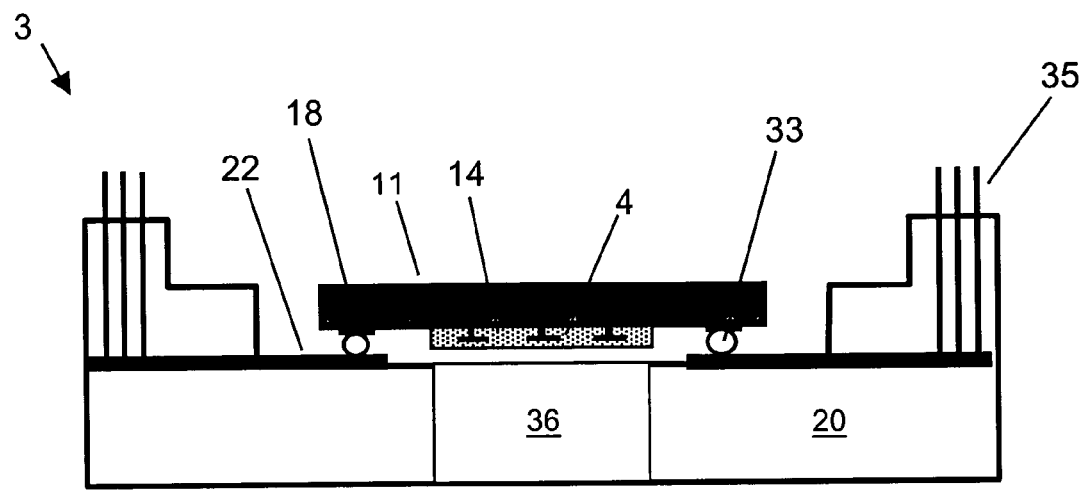
FIGS. 5a–5f show schematic cross-section views of a fourth example of a microelectronic device, according to the present invention.

First, in FIG. 5a, an intermediate assembly 3 is provided, comprising a microelectronic device flip-chip mounted to a ceramic PGA (Pin Grid Array) package 20. Package 20 may be made of a LTCC or HTCC multilayered ceramic material. The microelectronic device comprises an active area with unreleased MEMS elements 4 encased in sacrificial coating 14, disposed on silicon die 11. Package 20 comprises an aperture 36 that is aligned with the active area of the device. Solder (or conductive polymer) balls or bumps 33 electrically interconnect bond pads 18 located on die 11 to conductive lines/traces 22 located on package 20. Pin leads 35 are connected to conductive lines 22.

Figure 5B:
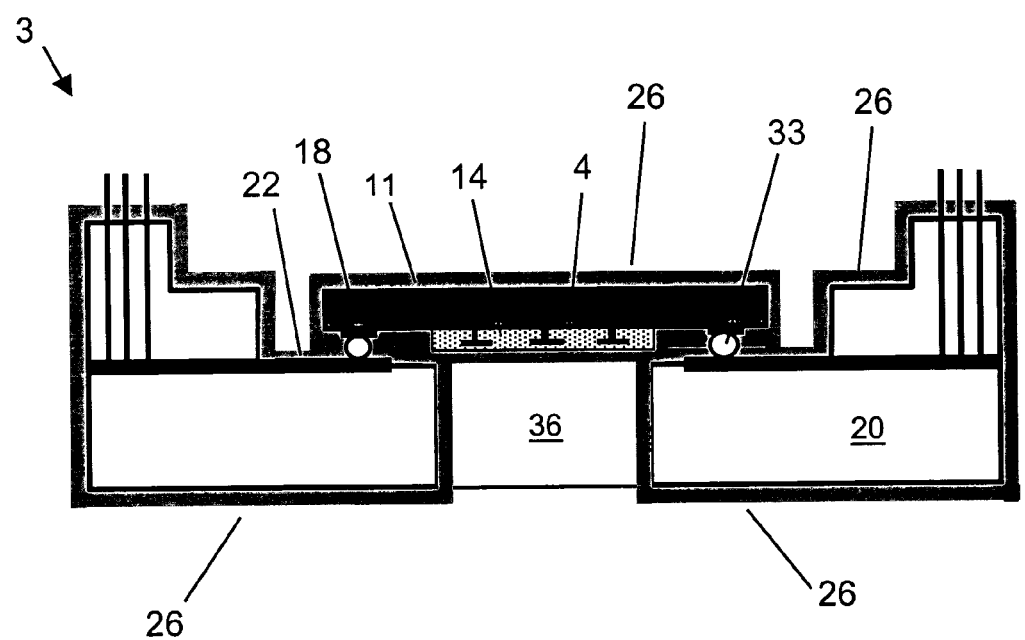

Next, in FIG. 5b, substantially all surfaces of intermediate assembly 3 are coated with a thin, electrically insulating protective coating 26 (e.g., parylene).

Figure 5C:
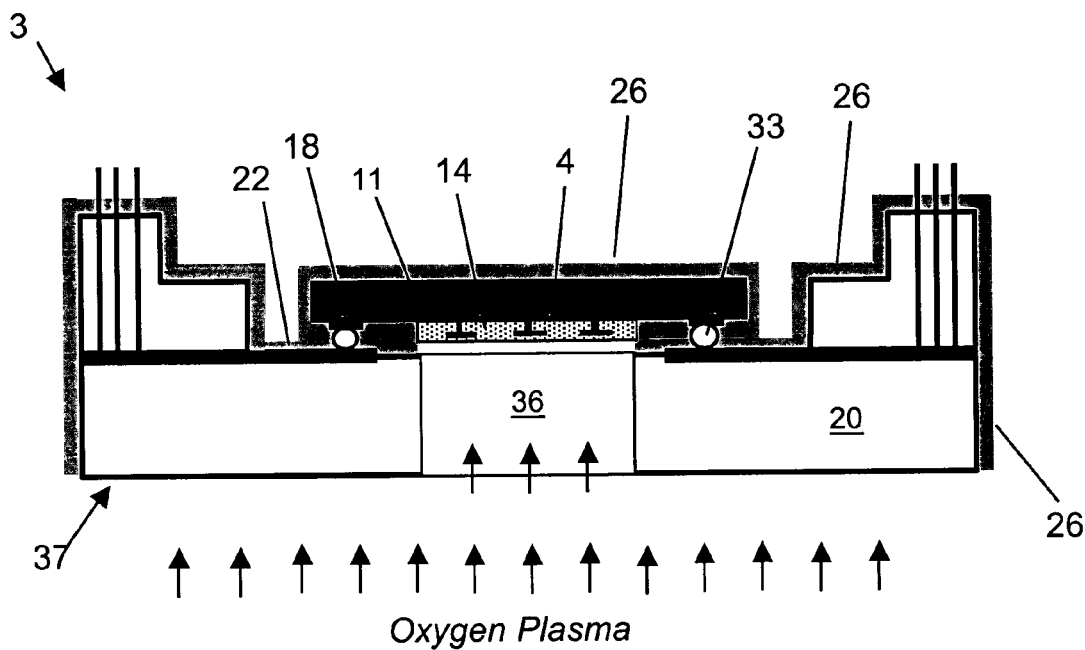

Next, in FIG. 5c, protective coating 26 is selectively removed from the active area by exposing the bottom surface 37 of substrate 20 to a plasma etch streaming through aperture 36. The solid bottom surface 37 of substrate 20 serves as a natural, self-contained mask to prevent the line-of-sight plasma etch from removing the protective coating 26 from the passive area. Alternatively, the protective coating 26 can comprise a photopatternable (photoimagable) photoresist material, e.g., SU-8, in which case the aperture 36 serves as the artwork.

Figure 5D:
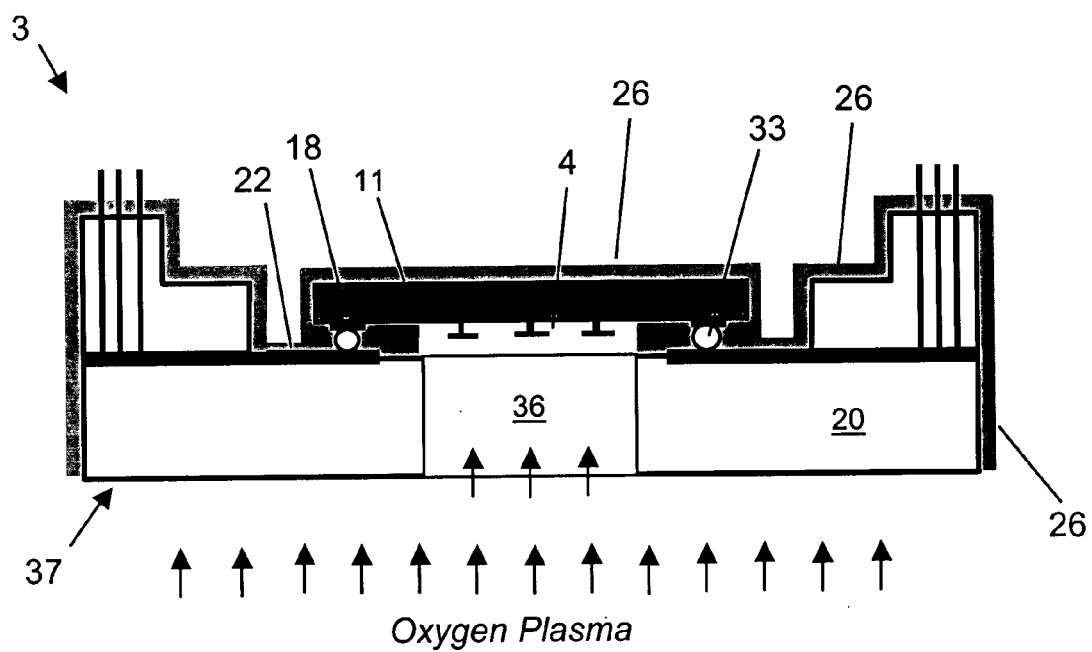

Next, in FIG. 5d, the plasma etch streaming through aperture 36 removes sacrificial coating 14 from MEMS elements 4, thereby releasing them. Removal of both the protective coating 26 and the sacrificial coating 14 may be performed in a single, continuous plasma etch step.

Figure 5E:
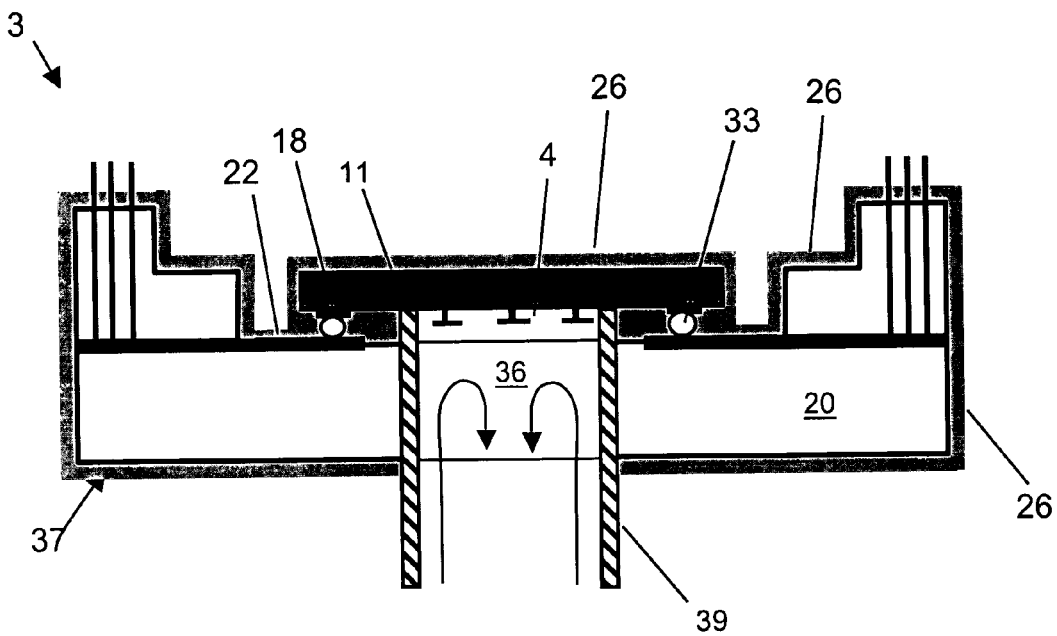

Alternatively, in FIG. 5e, a wet acid etchant can be sprayed through aperture 36 onto sacrificial coating 14 to etch and remove the coating. Gasket or funnel 39 may be used to confine the spray of acid (e.g., a Teflon® funnel). A commercially-available "jet decapsulator" tool may be used to perform the localized wet etching step. Assembly 3 can be held in the inverted position during localized wet etching, which allows debris to fall away from the package, thereby reducing potential contamination.

Figure 5F:
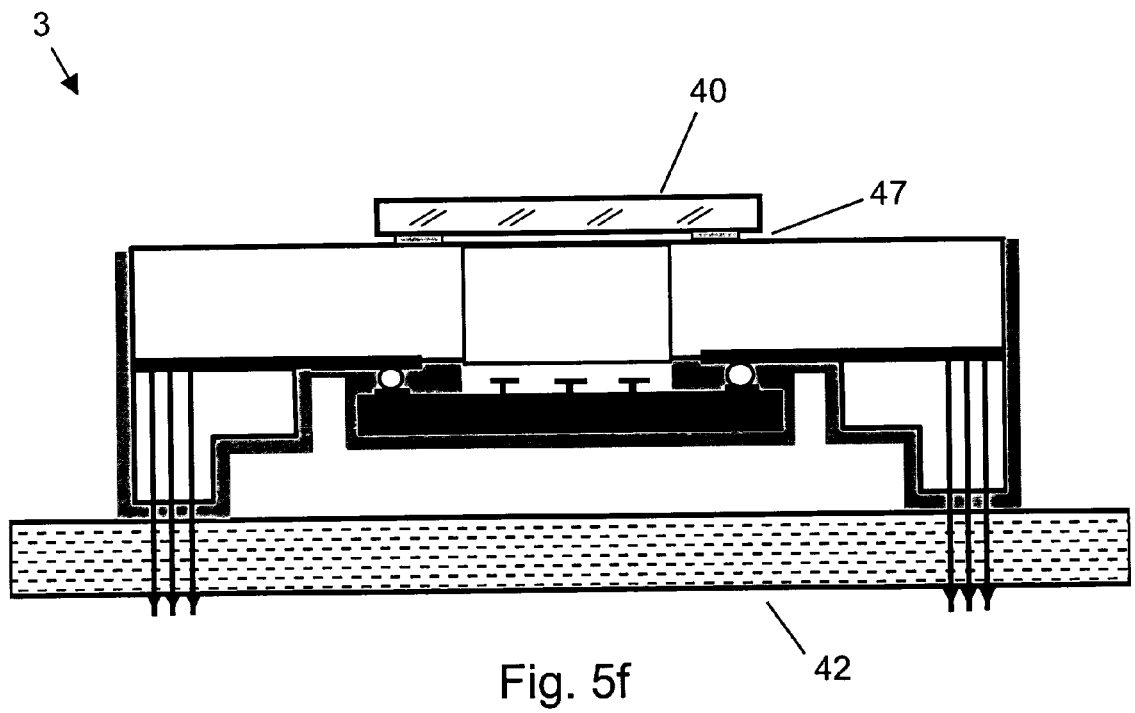

Next, in FIG. 5f, transparent window 40 is mounted to package 20 via ring seal 41. Window 40 covers aperture 36. Window 40 provides optical access to MEMS elements 4. Then, package 20 is mounted and electrically interconnected to a printed wiring board 42, according to the present invention.

FIGS. 6a–6d illustrate a fifth example of a series of steps for packaging a microelectronic device in a "package first, release later" scheme.

Figure 6A:
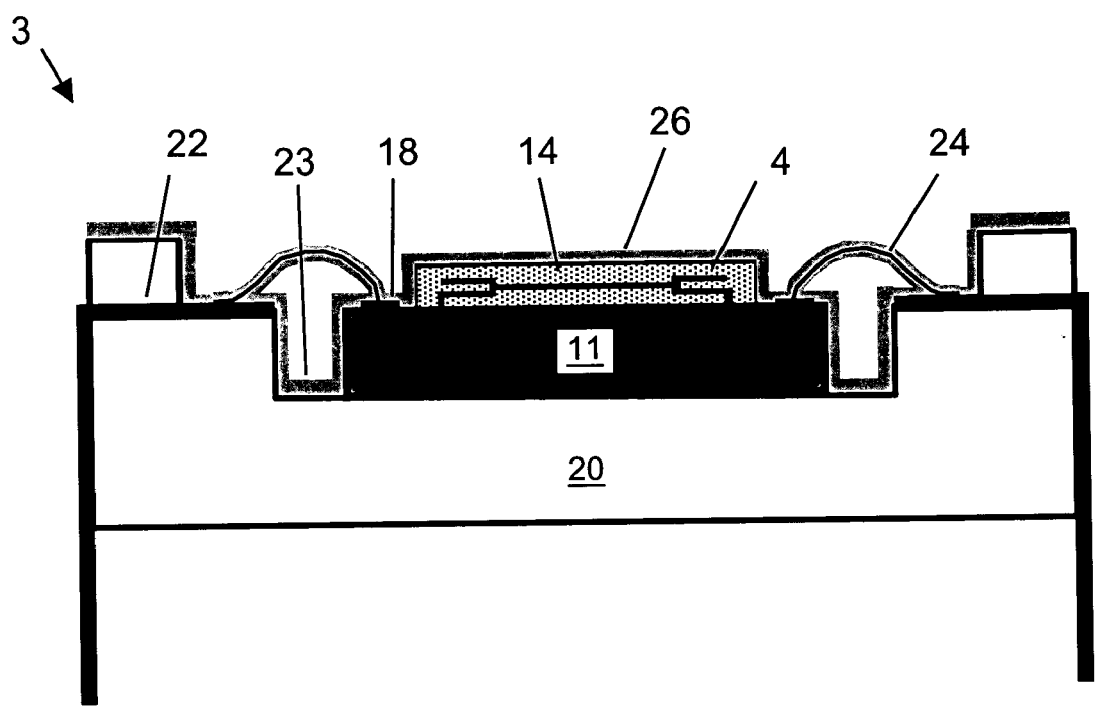
FIGS. 6a–6d show schematic cross-section views of a fifth example of a microelectronic device, according to the present invention.

First, in FIG. 6a, an intermediate assembly 3 is provided comprising a silicon die 11 die-attached to the floor 23 of package 20, with wirebonded interconnections 24 made between bond pads 18 located on die 11 and conductive lines 22 located on package 20. Package 20 may comprise a ceramic package, such as the CERDIP package illustrated in this Figure, which may be made of a LTCC or a HTCC ceramic multilayered material. Unreleased MEMS elements 4, encased in sacrificial material 14, are disposed on silicon die 11. A thin, electrically insulating protective coating 26 has been applied to the active and passive areas of the device, and interior surfaces of package 20, including the top surface of package 20.

Protective coating 26 may comprise a photopatternable/photoimagable photoresist material (e.g., SU-8 and SU-8 2000). SU-8 (formulated in gamma butyrolactone solvent) and SU-8 2000 (formulated in cyclopentanone solvent), both sold by MicroChem, Inc., are epoxy based negative resists that are optically transparent, but sensitive to near-UV radiation. They are based on EPON SU-8 epoxy resin (from Shell Chemical) originally developed and patented by IBM (see, e.g., U.S. Pat. No. 4,882,245). These resists can be applied as with a wide range of film thicknesses, from <1 micron to >300 microns using single spin coat processes. These resists can also be applied by spraying. High aspect ratios >20 have been demonstrated with standard contact lithography equipment or projection printing. High aspect ratio structures in very thick films can be imaged with optimized lithographic processes. Optimization techniques include: spectral shaping of the exposure bandwidth to remove shorter wavelengths that are absorbed in the upper portion of the resist film and result in negatively sloped sidewalls; fine tuning the exposure dose and post exposure bake (PEB) process in order to obtain uniform cross-link density throughout the resist film, and by optimizing the prebake and develop process. These results are due to the low optical absorption in the UV range which only limits the thickness to 2 mm for the 365 nm-wavelength where the photo-resist is the most sensitive (i.e., for this thickness 100% absorption occurs). SU-8 and SU-8 2000 are highly resistant to solvents, acids (including HF) and bases and has excellent thermal stability, making it well suited for applications in which cured structures are a permanent part of the device. SU-8 and SU-8 2000 are available in low viscosity (less than about 50 cts), and can be heated (e.g., to about 50° C.) to further lower its viscosity. Using warmed SU-8 allows the material to run out of the cavity in package 20 and leave a thin film, after being coated by liquid SU-8. SU-8 and SU-8 2000 are solvent developable. A number of safer solvent systems, including SU-8 developer (MicroChem, Inc.), ethyl lactate, and diacetone alcohol can be used. A two-stage immersion develop process can be used to increase throughput, especially for very thick films or cyclopentanone (SU-8 2000 thinner), followed by a second bath of SU-8 developer. SU-8 is a highly functional epoxy, and therefore extremely difficult to strip (i.e., remove). However, RIE plasma ashing, laser ablation, molten salt baths, $CO_2$ crystal and water jets and pyrolysis can be used to strip SU-8.

Figure 6B:
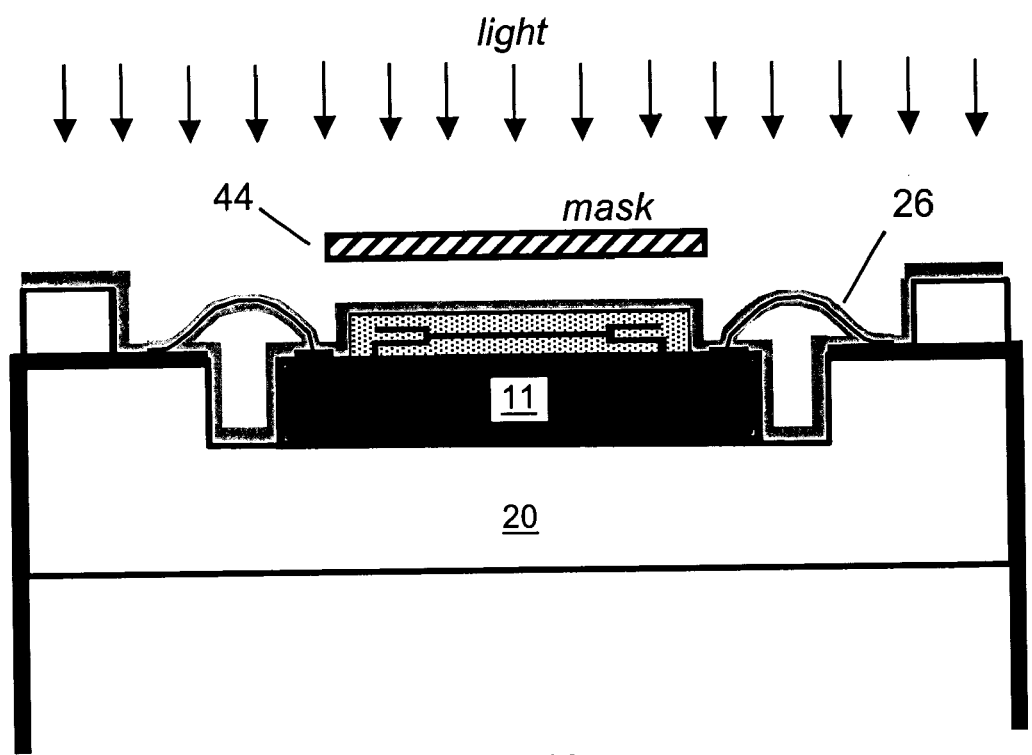

Next, in FIG. 6b, mask 44 is placed over the active area (but not the passive area) and the masked assembly is exposed to radiation (e.g., near-UV light). This is the arrangement that would be used for a negative-type photoresist coating 26. Alternatively, if the photoresist coating 26 was a positive-type material, then mask 44 would occlude the passive area, but leave the active area unmasked.

Figure 6C:
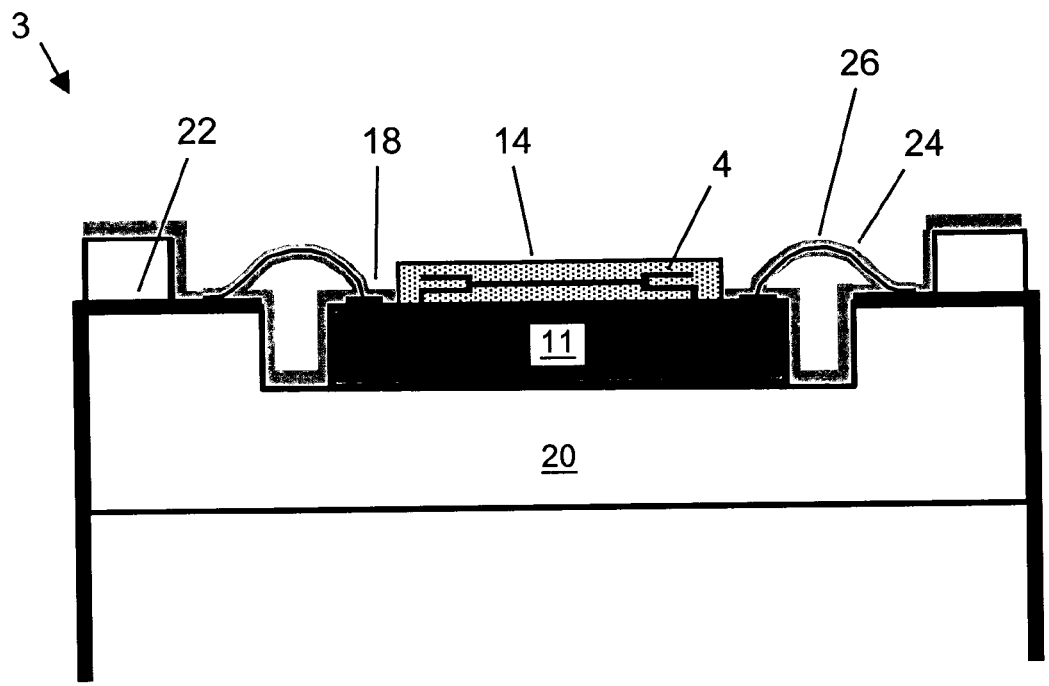

Next, in FIG. 6c, negative-type photoresist material 26 is developed, which dissolves and removes the unexposed portion of the protective coating 26 that previously masked (i.e., located over the active area). The opposite would be true for a positive-type resist material.

Figure 6D:
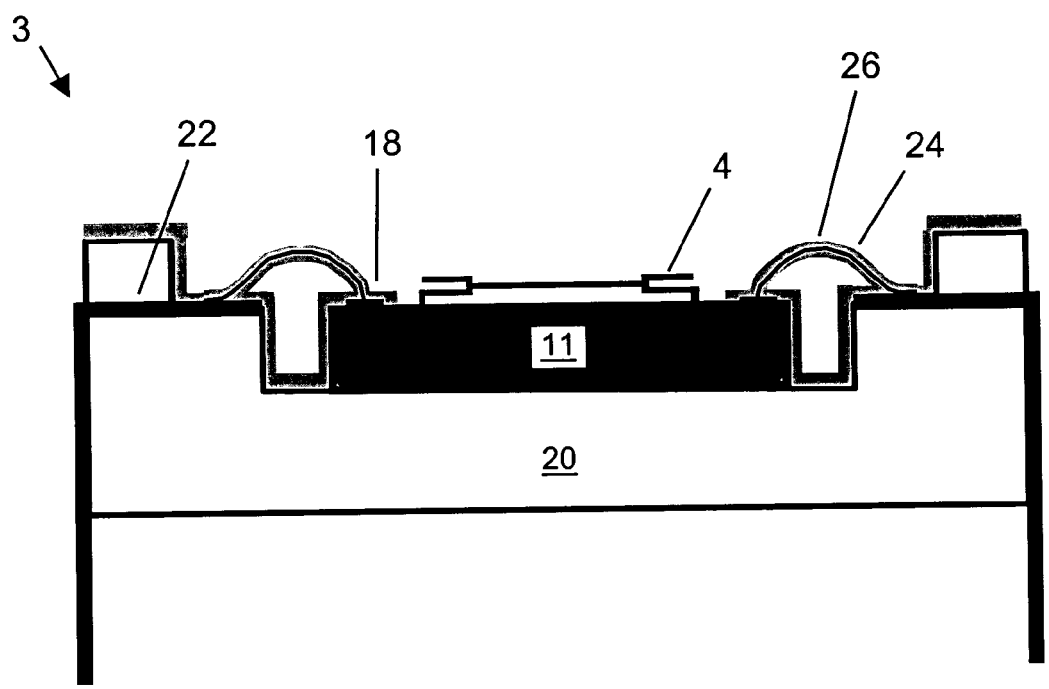

Finally, in FIG. 6d, sacrificial coating 14 is removed using a removal technique that doesn't attack the protective coating 26 (e.g., SU-8 is resistant to HF), thereby releasing the MEMS elements 4 (which then can be coated with an anti-stiction coating, and then dried).

In general, the sacrificial coating 14 that is removed during the MEMS release step may comprise glass, silicon nitride, or a vapor-deposited conformal coating, such as parylene.

An alternative approach to packaging of MEMS devices using a "package first/release later" scheme is to prevent the protective coating 26 from being deposited on to the active area 16 in the first place (i.e., rather than having to selectively remove it from the active area in a later step).

In another embodiment of the present invention, after the protective coating 26 has been applied to the passive area 12, but not to the active area 16, an optional step may be performed, comprising applying a thin overcoat of a conductive material (e.g., metal) on to the passive area. Since the underlying electrical conductors and interconnections within the passive area have already been coated with the thin, electrically insulating protective coating 26, the thin overcoat of conductive material does not short-circuit the conductors. Application of the thin, conducting overcoat acts as a Faraday shield that can reduce or eliminate, electromagnetic radiation from being transmitted by these current-carrying conductors, lines, interconnects, etc. Shielding of EM radiation can reduce or eliminate problems with cross-talk interference between neighboring conductors.

Applying a thin, conducting overcoat may comprise, for example, evaporating, sputtering, chemical vapor deposition, physical vapor deposition, ion beam plating, or combinations thereof. The electrically conductive overcoat may comprise a metal, gold, tungsten, nickel, aluminum, copper, titanium, molybdenum, tin, tantalum, alloys of those, electrically-conductive polymers, carbon, doped carbon, or doped silicon, or combinations thereof. The thin, conductive overcoat may be applied to other areas of the assembly, substrate, etc. For some materials, e.g., gold, the thin conductive overcoat can also be applied to active, released MEMS elements, such as micromirrors. A single coating of gold can therefore serve two purposes, i.e., as a reflective coating on the micromirrors, and as an EM shield on the passive conductors.

Alternatively, a gold or other metallic overcoat could be applied after protective coating 26 has been deposited, but before the MEMS elements are released, to shield the insulating protective coating 26 from being attacked by an acid release etchant.

Figure 7A:
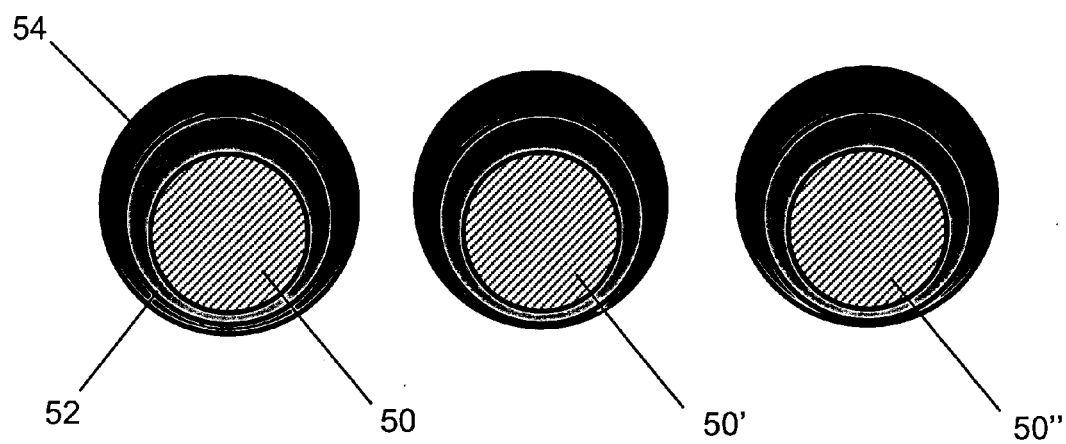
FIG. 7a shows a cross-section view of a first example of a set of three wirebond interconnections coated with a thin, electrically insulating protective coating, and then over-coated with an electrically conductive material applied from one side of the wires, according to the present invention.

FIG. 7a shows a cross-section view of a first example of a set of three wirebond interconnections 50, 50', 50" coated first with a thin, electrically insulating coating 52, and then overcoated with an electrically conductive material 54 (e.g., metal). Wire 50 is directly coated with the protective, electrically insulating material 52. In this embodiment, insulating coating 52 has been applied from one side only (e.g., by sputtering, evaporation, ion beam deposition, etc.), thereby creating a non-uniform thickness around the circumference of the wire. Electrically conductive overcoat 54 is deposited on top of insulating coating 52, also by a one-sided process (e.g., by sputtering gold). In this embodiment, electrically conductive overcoat 54 does not span across the three wires 50, 50', 50" (i.e., is not continuous across adjacent wires). Electrically conductive overcoat 54 prevents shield electromagnetic radiation from being radiated from individual wires (like a coaxial cable), thereby reducing or preventing problems with EM cross-talk in-between adjacent conductors (wires).

Figure 7B:
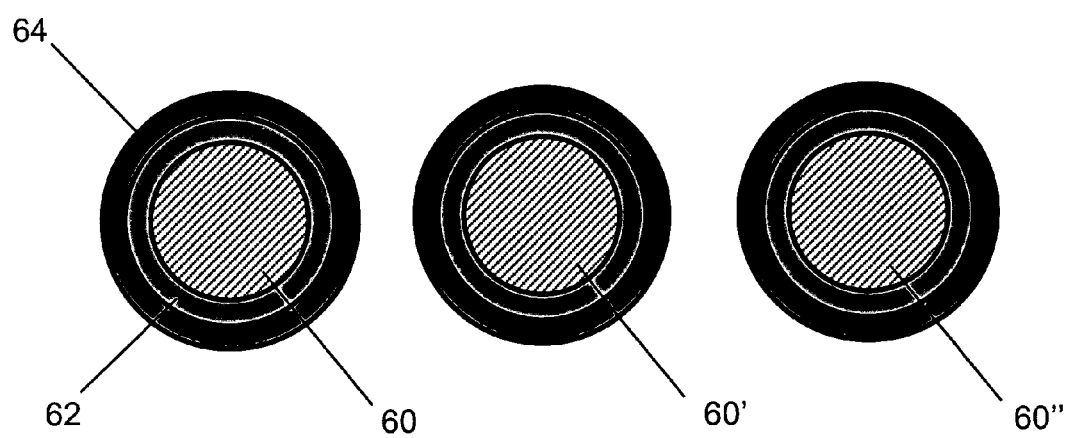
FIG. 7b shows a cross-section view of a second example of a set of three wirebond interconnections coated with a thin, electrically insulating protective coating, and then overcoated with an electrically conductive material applied uniformly around each wire, according to the present invention.

FIG. 7b shows a cross-section view of a second example of a set of three wirebond interconnections 60, 60', 60" coated with an electrically insulating coating 62 that is overcoated with an electrically conductive material 64. In this embodiment, both coatings 62 and 64 have been applied by a process that produces essentially uniform thickness coatings (e.g., vapor-deposition of parylene, or liquid coating of a low-viscosity photoresist). Also, in this embodiment, overcoat 64 does not span across the three wires 60, 60', 60".

Figure 7C:
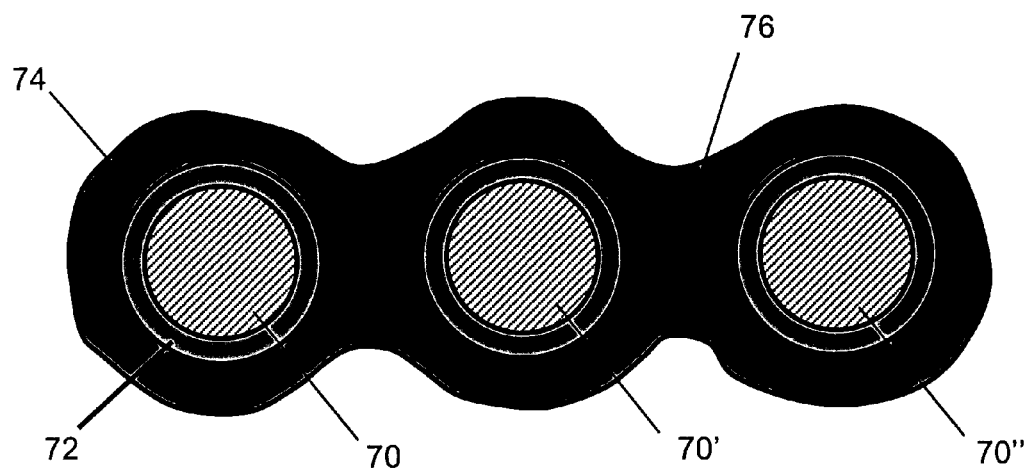
FIG. 7c shows a cross-section view of a third example of a set of three wirebond interconnections coated with a thin, electrically insulating protective coating, and then overcoated with a film of electrically conductive material that is continuous in-between adjacent wires, according to the present invention.

FIG. 7c shows a cross-section view of a third example of a set of three wirebond interconnections 70, 70', 70" coated with an electrically insulating coating 72 that is overcoated with a continuous film 74 of electrically conductive material. Overcoating 74 can be continuous if wires 70, 70', 70" are spaced closely enough to permit a web 76 of the electrically conductive material to span across the gap in-between adjacent wires.

Figure 7D:
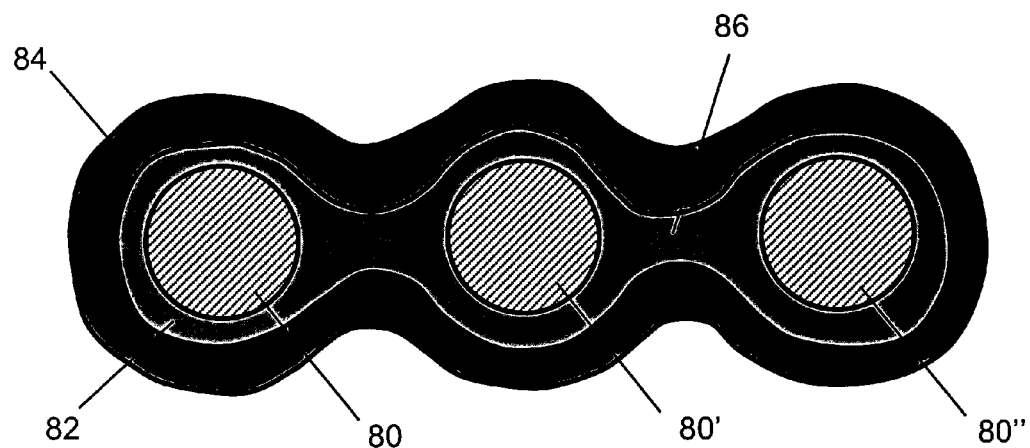
FIG. 7d shows a cross-section view of a fourth example of a set of three wirebond interconnections coated with a thin, electrically insulating protective coating that is continuous in-between adjacent wires, and then overcoated with a film of electrically conductive material that also is continuous in-between adjacent wires, according to the present invention.

FIG. 7d shows a cross-section view of a fourth example of a set of three wirebond interconnections 80, 80', 80" coated with a continuous electrically insulating coating 82 that is overcoated with a continuous film 84 of electrically conductive material. Electrically insulating coating 82 spans across the gap in-between adjacent wires, thereby allowing overcoating 84 to also be continuous.

In any of these embodiments, conducting overcoat (64, 74, 84) may be grounded through the use of a grounding strap, wire, strip, link, etc. (not shown), or, alternatively, through a conductive via connected to a grounding pad or conductive coating located on the backside of the die or substrate.

Figure 8A:
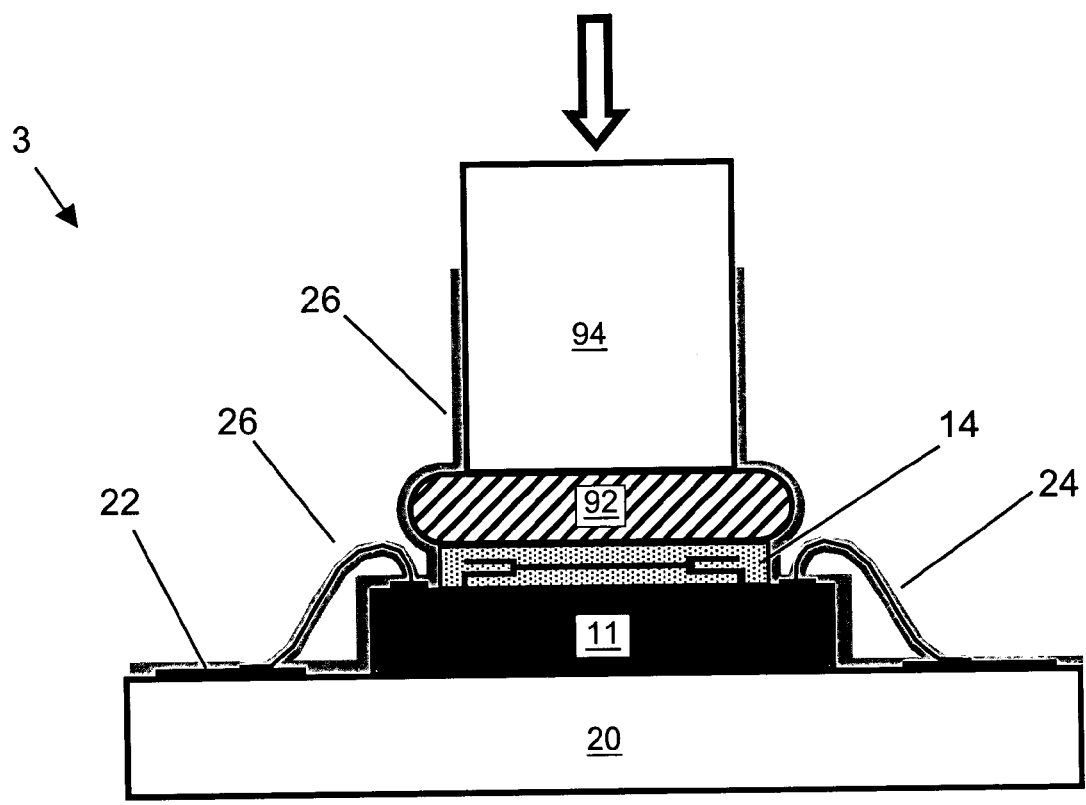
FIGS. 8a–8b show schematic cross-section views of a sixth example of a microelectronic device, according to the present invention.
Figure 8B:
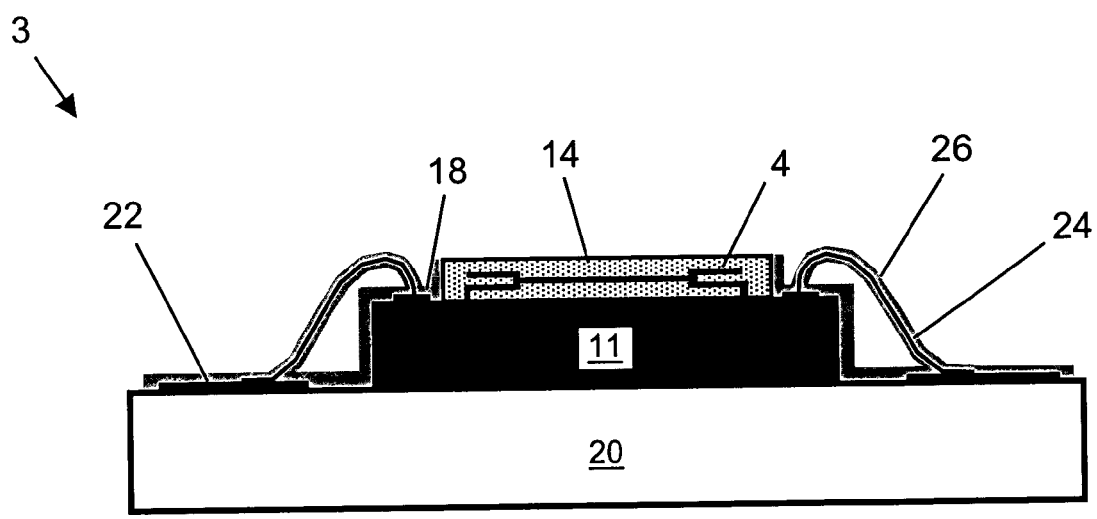

FIGS. 8a–8b illustrate schematically a first example of a technique, according to the present invention, for preventing protective coating 26 from being deposited on to active area 16. In FIG. 8a, an elastomeric plug 92 (e.g., rubber, silicone) has been compressed on to the active area 16 by plunger 94, and then the protective coating 26 is applied to the passive area 12, but not to the active area 16 because plug 92 occludes the active area 16. Then, in FIG. 8b, elastomeric plug 92 is removed, which exposes active area 16 for further processing (e.g., releasing MEMS elements 4 by removing sacrificial coating 14, without removing protective coating 26 from passive 12). The teachings of U.S. Pat. No. 5,897,338 to Kaldenberg, which is incorporated herein by reference, provide further description of how to use the technique of an elastomeric plug during fabrication.

Figure 9A:
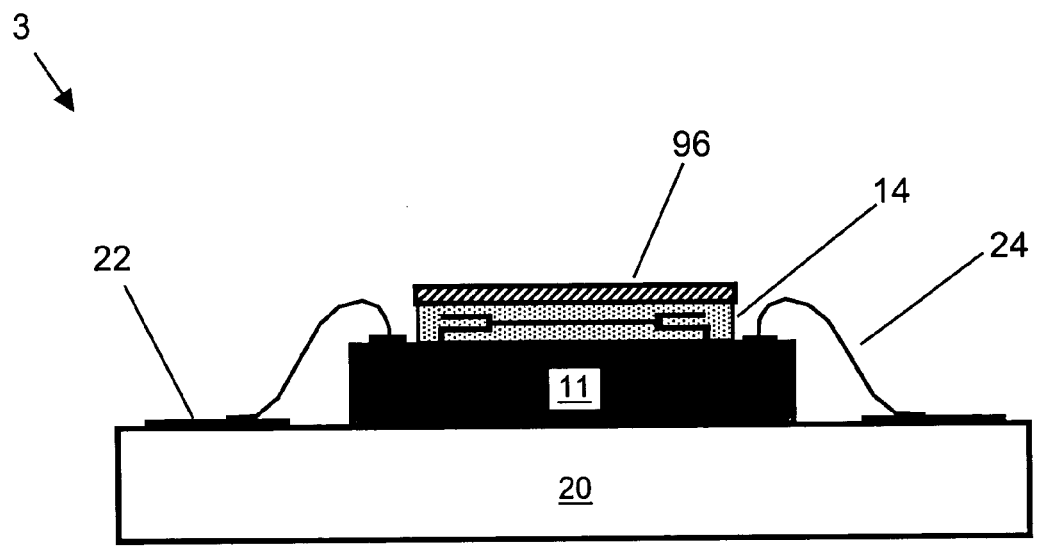
FIGS. 9a–9e show schematic cross-section views of a seventh example of a microelectronic device, according to the present invention.
Figure 9B:
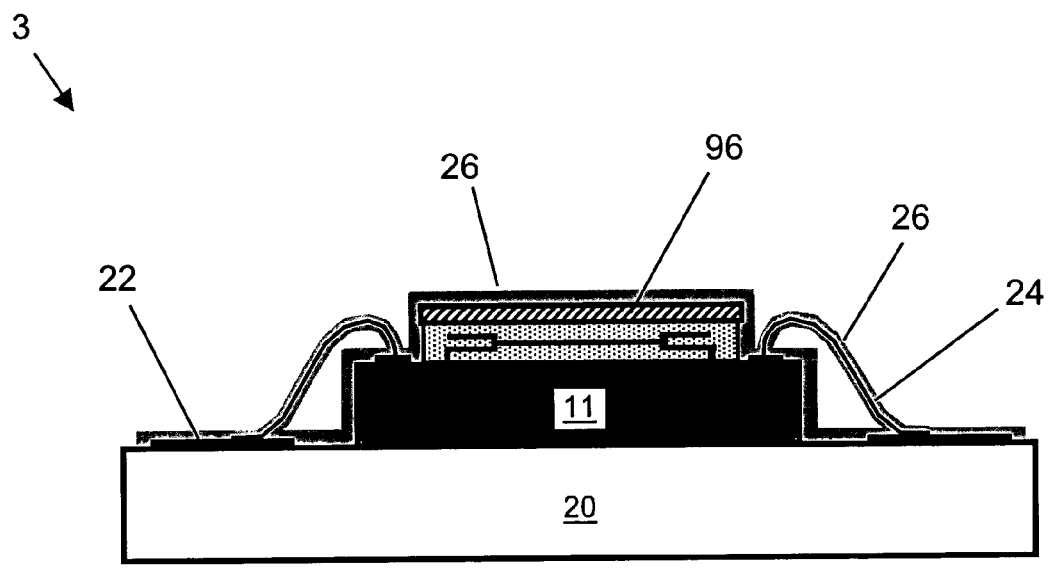

FIGS. 9a–9d illustrate schematically a second example of a technique, according to the present invention, for preventing protective coating 26 from being deposited on to active area 16. In FIG. 9a, active area 12 has been covered with a patch 96 of temporary material that is attached to active area 16 (e.g., attached to sacrificial coating 14). Patch 96 of temporary material may comprise a piece of adhesive tape, a non-adhesive tape, Teflon® tape, a polymer glob, a latex member, a water-soluble coating (e.g., a starch, a sugar, etc.), or an acid-etchable coating. Next, in FIG. 9b, protective coating 26 is applied to both the passive area 12 and patch 96.

Figure 9C:
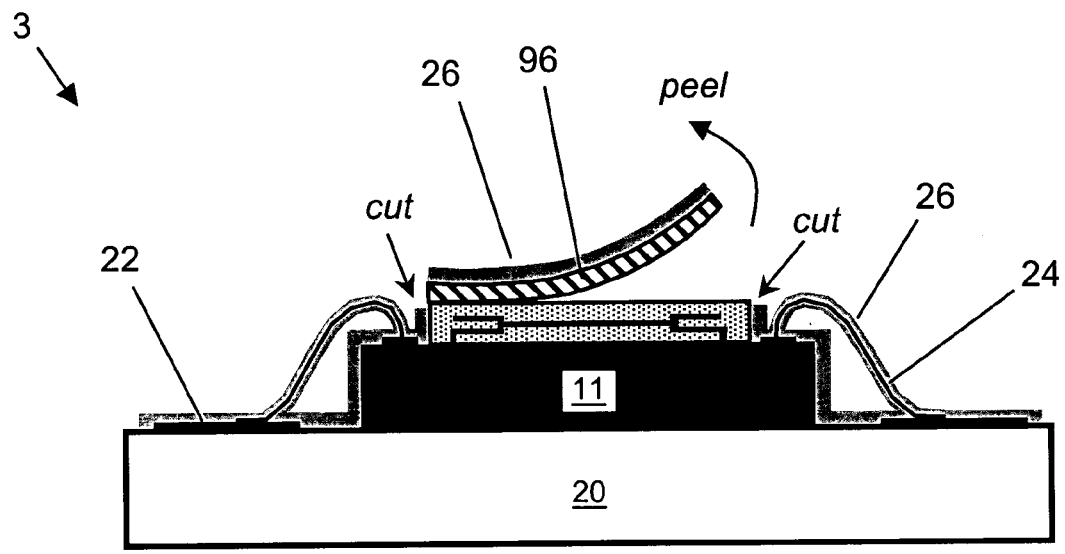

Next, in FIG. 9c, any portion of protective coating 26 that resides on top of patch 96 is removed (e.g., by laser ablation, mechanical abrasion, scuffing, scratching, etc.). After coating 26 is removed from on top of patch 96, then patch 96 is removed.

Alternatively a knife or laser, etc. can cut or slice through the protective coating 26 completely around the perimeter of the patch 96. Then, patch 96 is peeled back away from sacrificial coating 14, and easily removed, taking along with it that part of coating 26 that is attached on top, as shown in FIG. 9c.

Figure 9D:
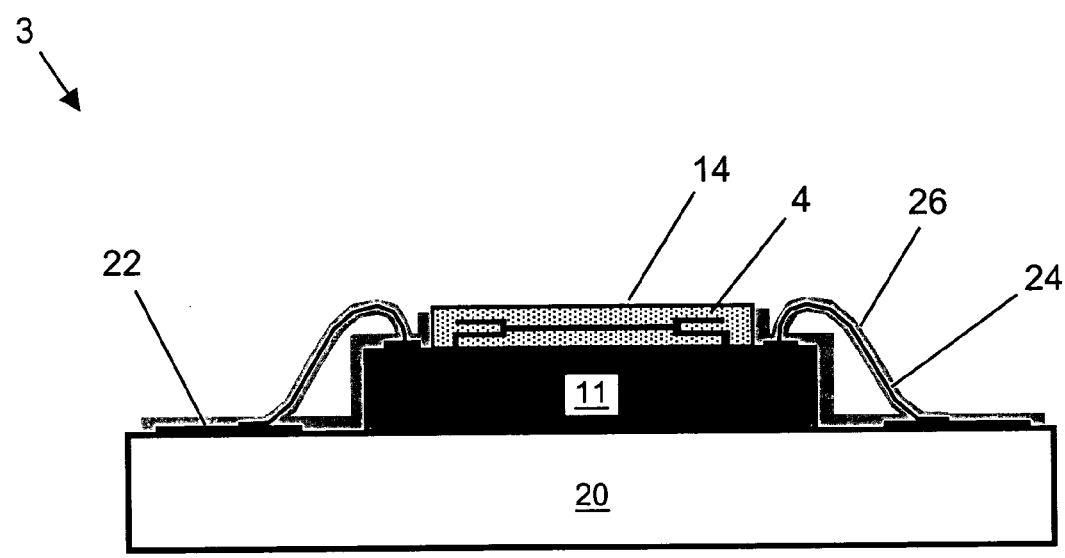
Figure 9E:
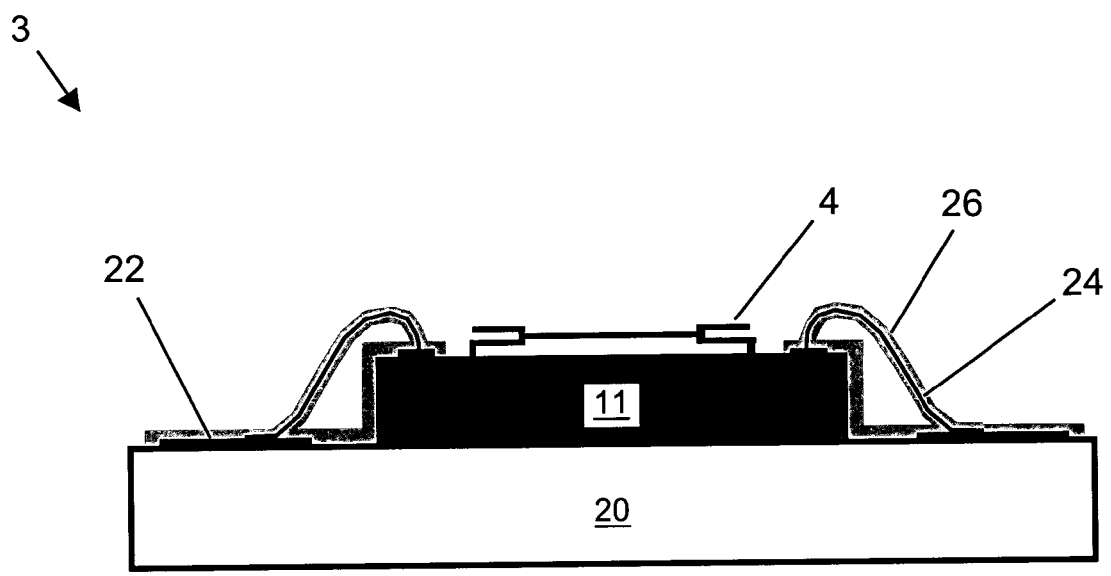

Next, in FIG. 9d, patch 96 is removed, thereby exposing active area 16. Finally, in FIG. 9e, MEMS elements 4 are released by removing sacrificial coating 14, while not removing protective coating 26 from passive 12.

Alternatively, referring still to FIGS. 9a–9e, that portion of protective coating 26 that resides on top of patch 96 can be removed at the same time that underlying patch 96 of temporary material is removed, i.e., by cutting around the perimeter of patch 96 with a knife or a laser to isolate it from the passive area 12, and then removing the underlying patch 96 that has the isolated section of protective coating 26 on top.

Figure 10A:
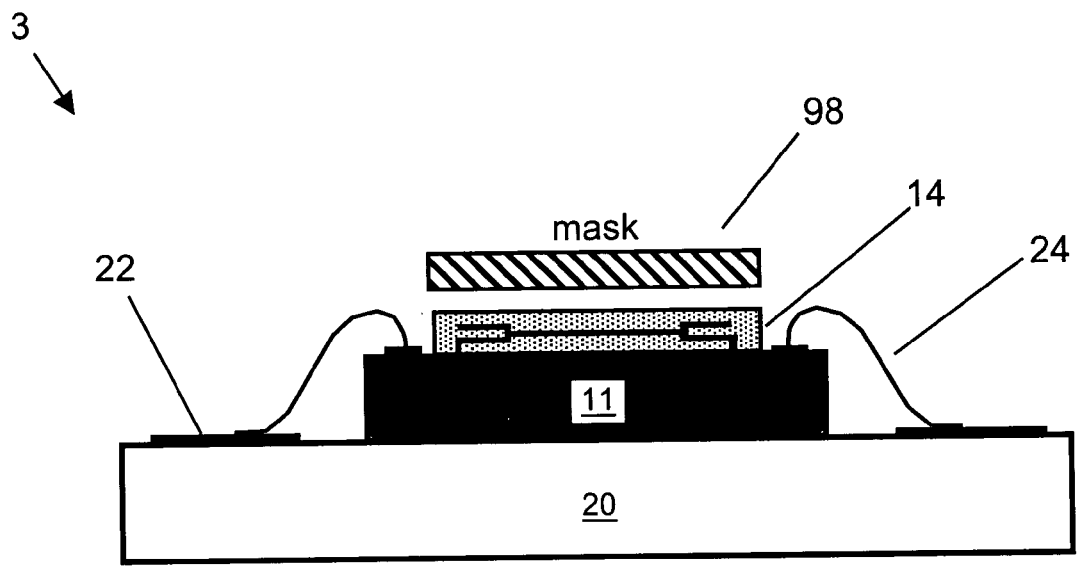
FIGS. 10a–10d show schematic cross-section views of an eighth example of a microelectronic device, according to the present invention.
Figure 10B:
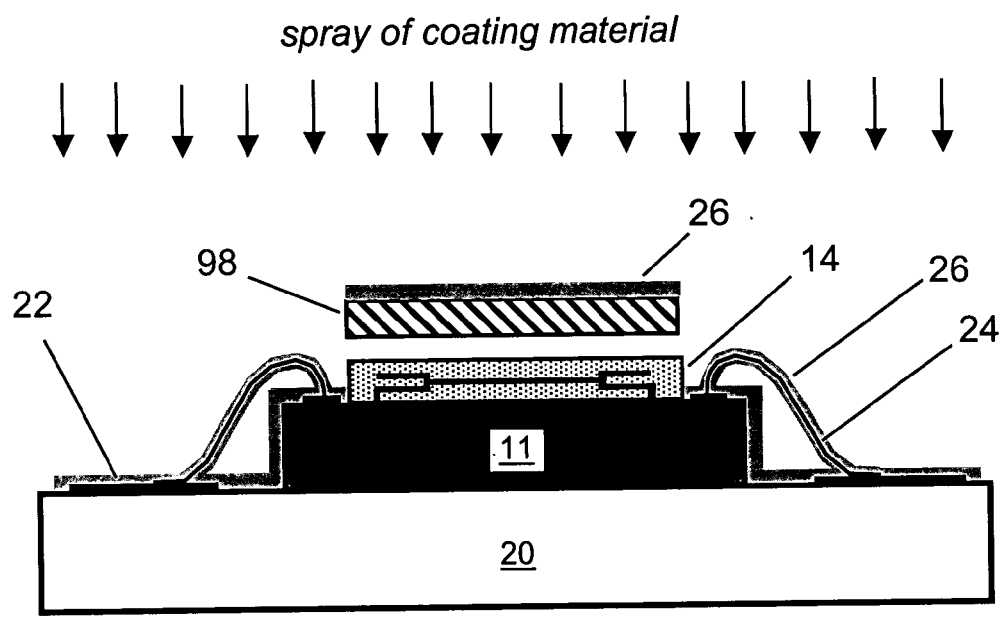
Figure 10C:
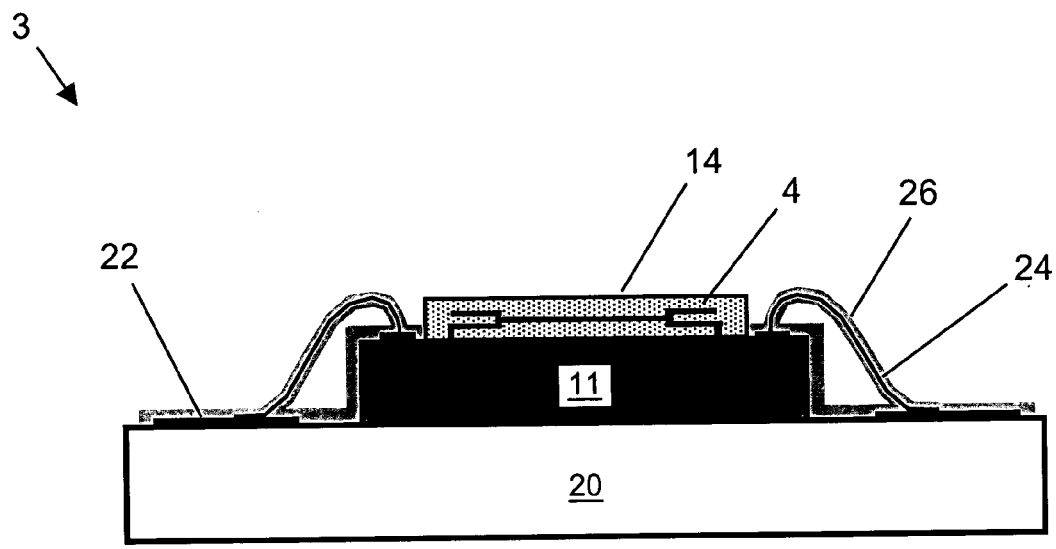
Figure 10D:
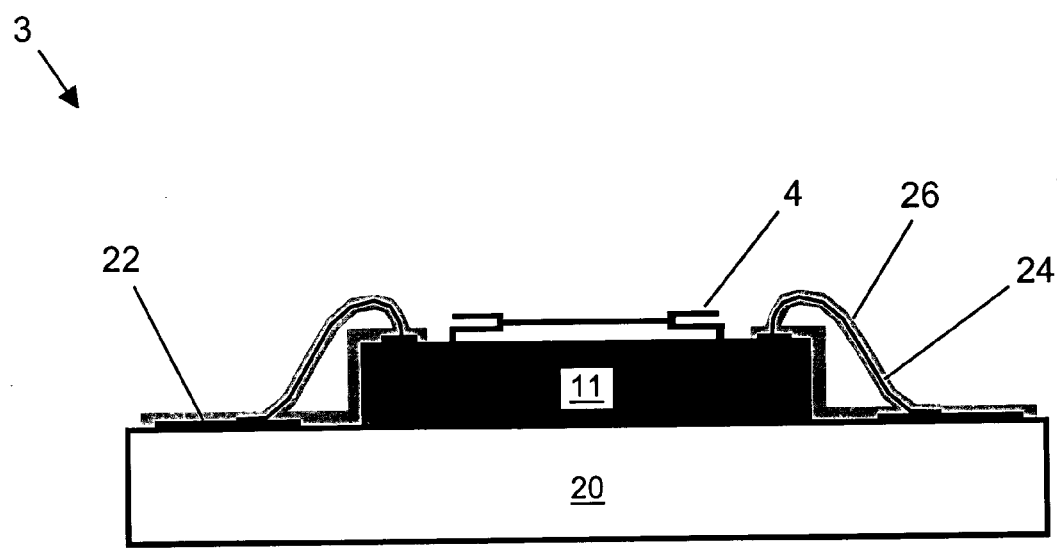

FIGS. 10a–10d illustrate schematically a third example of a technique, according to the present invention, for preventing protective coating 26 from being deposited on to active area 16. In FIG. 10a, active area 12 has been covered (i.e., occluded) by mask 98. Next, in FIG. 10b, protective coating 26 is applied, using a line-of-sight technique (e.g., sputtering, spraying, evaporating, ablating, streaming) to both the passive area 12 and mask 98, but not to active area 12 (mask 98 is covering it). Next, in FIG. 10c, mask 98 is removed, thereby exposing active area 16. Finally, in FIG. 10d, MEMS elements 4 are released by removing sacrificial coating 14, while not removing protective coating 26 from passive 12.

An alternative technique for removing protective coating 26 from active area 16 comprises direct removal by laser ablating that part of protective coating 26 that covers active area 16.

Figure 11A:
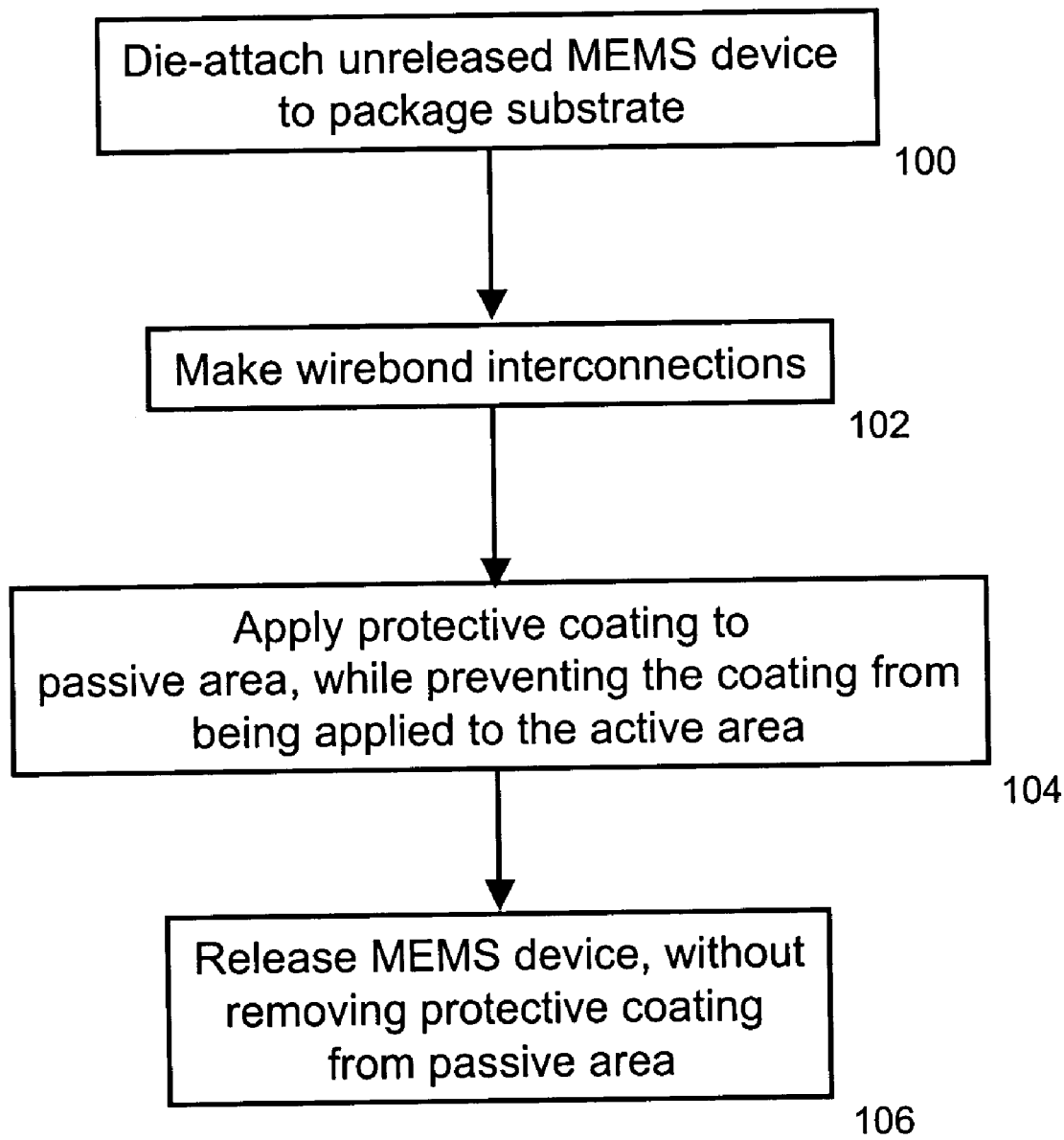
FIGS. 11a–11d shows examples of various sequences of method steps for performing certain embodiments of the present invention.

FIG. 11a illustrates a first example of a sequence of steps for packaging a MEMS microelectronic device, according to the present invention. In step 100, an unreleased MEMS device is die-attached to a package substrate. Then, in step 102, wirebond electrical interconnections are made from the MEMS device to the package. Then, in step 104, a thin, electrically insulating protective coating is applied to the passive area, while being prevented from being applied to the active area. Finally, in step 106, the MEMS device is released, without removing the protective coating from the passive area.

Figure 11B:
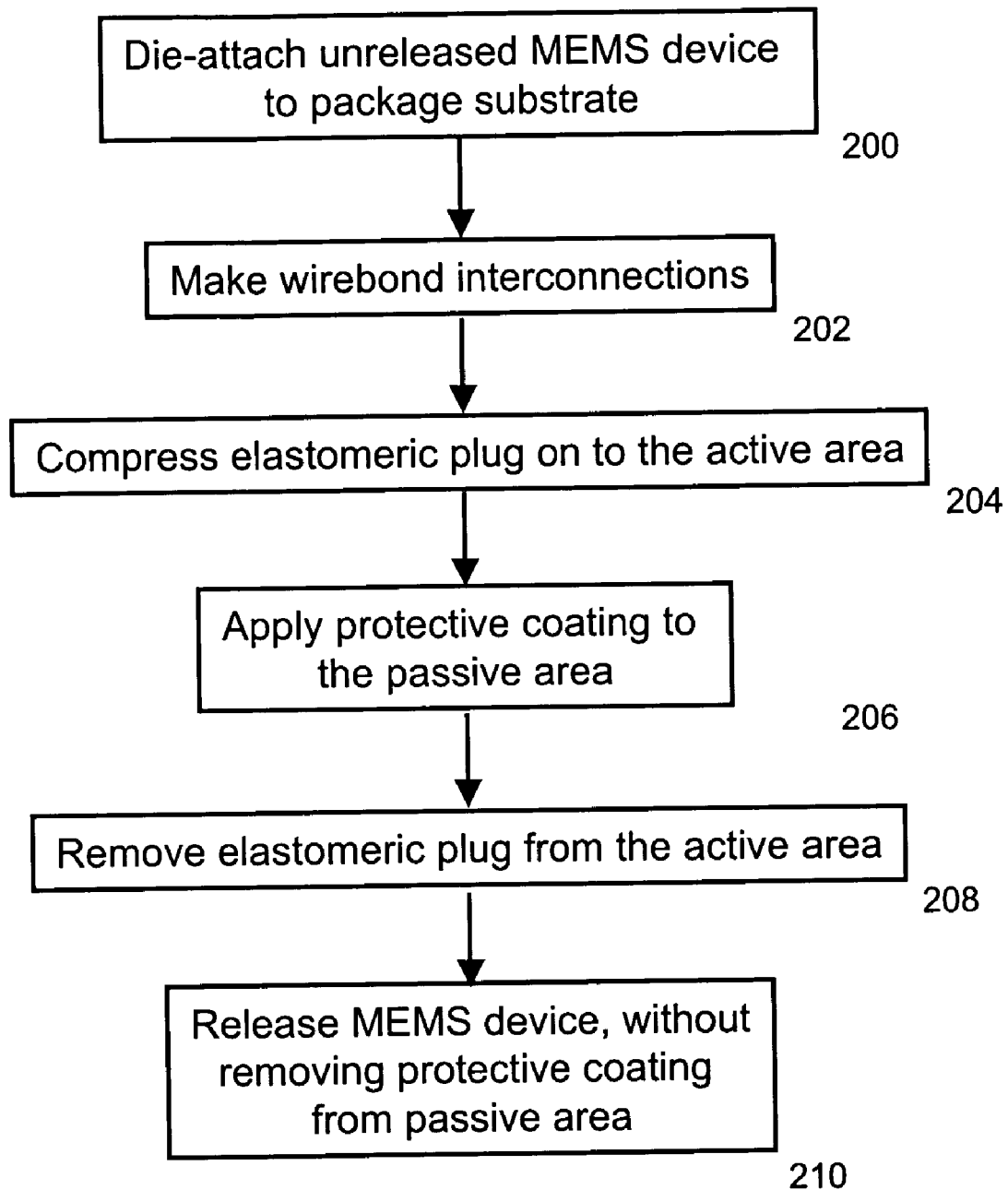

FIG. 11b illustrates a second example of a sequence of steps for packaging a MEMS microelectronic device, according to the present invention. In step 200, an unreleased MEMS device is die-attached to a package substrate. Then, in step 202, wirebond electrical interconnections are made from the MEMS device to the package. Then, in step 204, an elastomeric plug is compressed on to the active area. Then, in step 206, a thin, electrically insulating protective coating is applied to the passive area, while being prevented from being applied to the active area by the compressed elastomeric plug. Then, in step 208, the plug is removed, thereby exposing the active area. Finally, in step 210, the MEMS device is released, without removing the protective coating from the passive area.

Figure 11C:
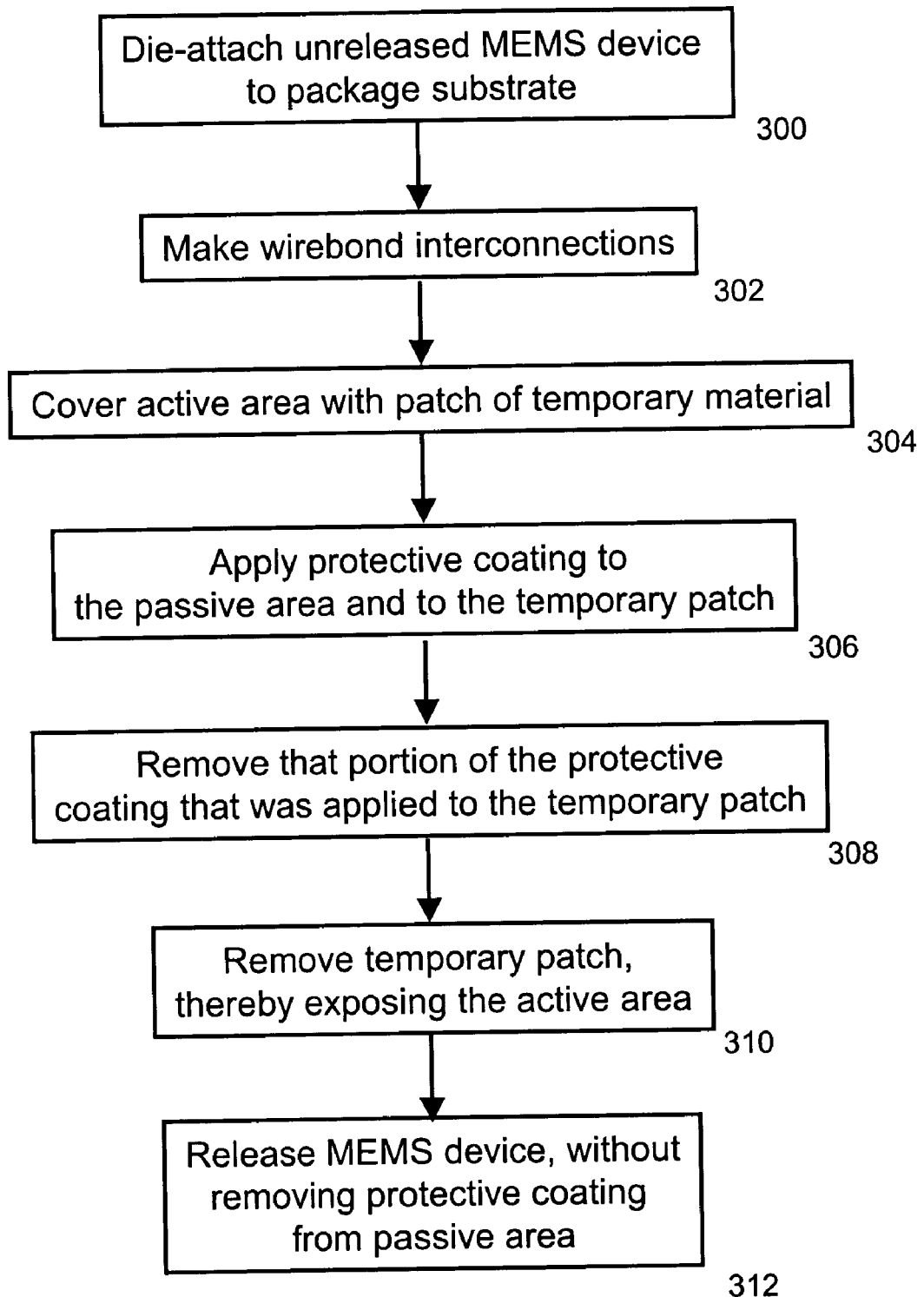

FIG. 11c illustrates a third example of a sequence of steps for packaging a MEMS microelectronic device, according to the present invention. In step 300, an unreleased MEMS device is die-attached to a package substrate. Then, in step 302, wirebond electrical interconnections are made from the MEMS device to the package. Then, in step 304, the active area is covered with a patch of temporary material. Then, in step 306, a thin, electrically insulating protective coating is applied to the passive area, while being prevented from being applied to the active area by the patch of temporary material that is attached to the active area. Then, in step 308, only that portion of the protective coating that was applied to the temporary patch is removed. Then, in step 310, the patch of temporary material is removed, thereby exposing the active area. Finally, in step 312, the MEMS device is released, without removing the protective coating from the passive area.

Figure 11D:
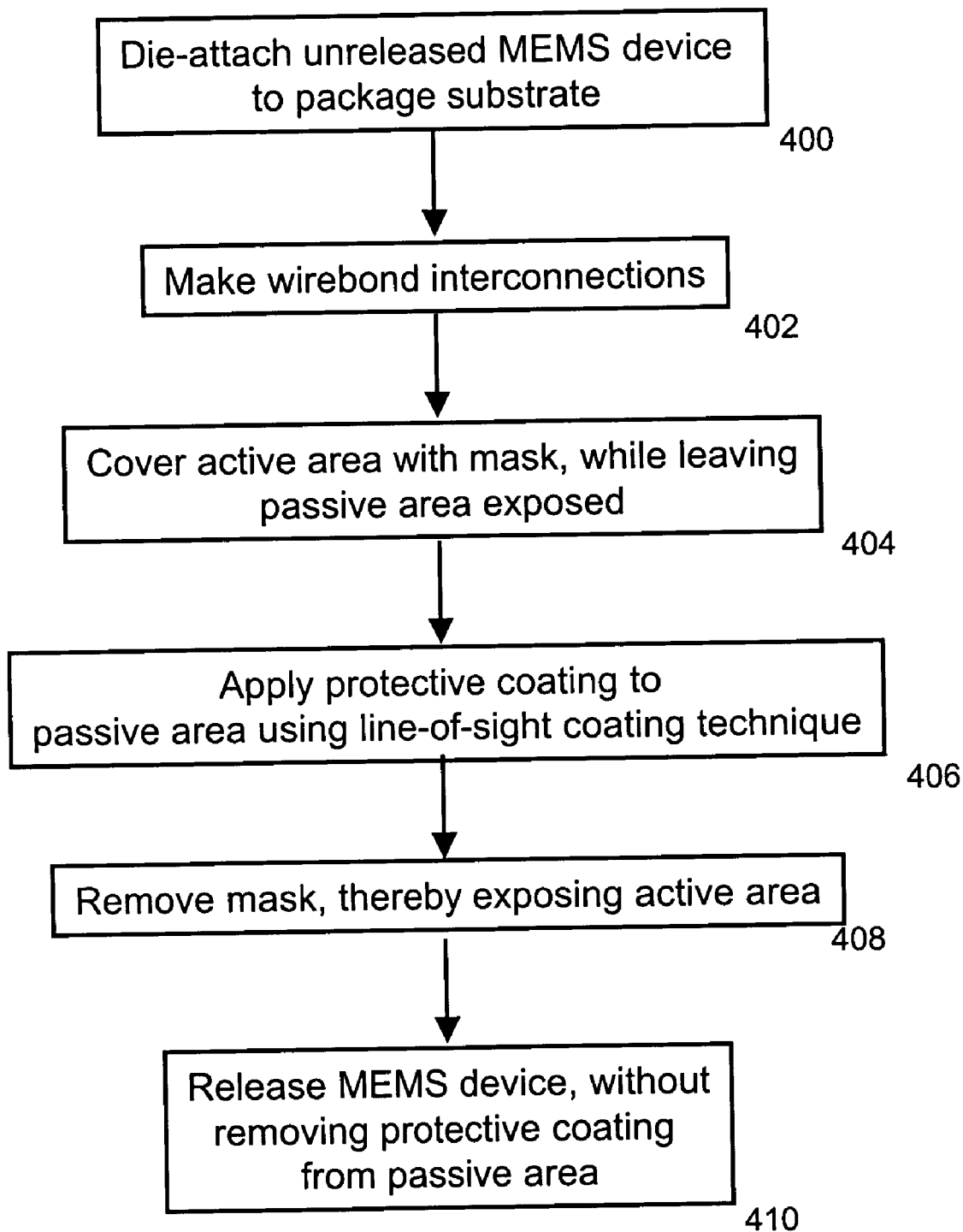

FIG. 11d illustrates a fourth example of a sequence of steps for packaging a MEMS microelectronic device, according to the present invention. In step 400, an unreleased MEMS device is die-attached to a package substrate. Then, in step 402, wirebond electrical interconnections are made from the MEMS device to the package. Then, in step 404, the active area is covered with a mask. Then, in step 406, a thin, electrically insulating protective coating is applied to the passive area using a line-of-sight technique, while being prevented from being applied to the active area by the mask. Then, in step 408, the mask is removed, thereby exposing the active area. Finally, in step 410, the MEMS device is released, without removing the protective coating from the passive area.

Figure 12A:
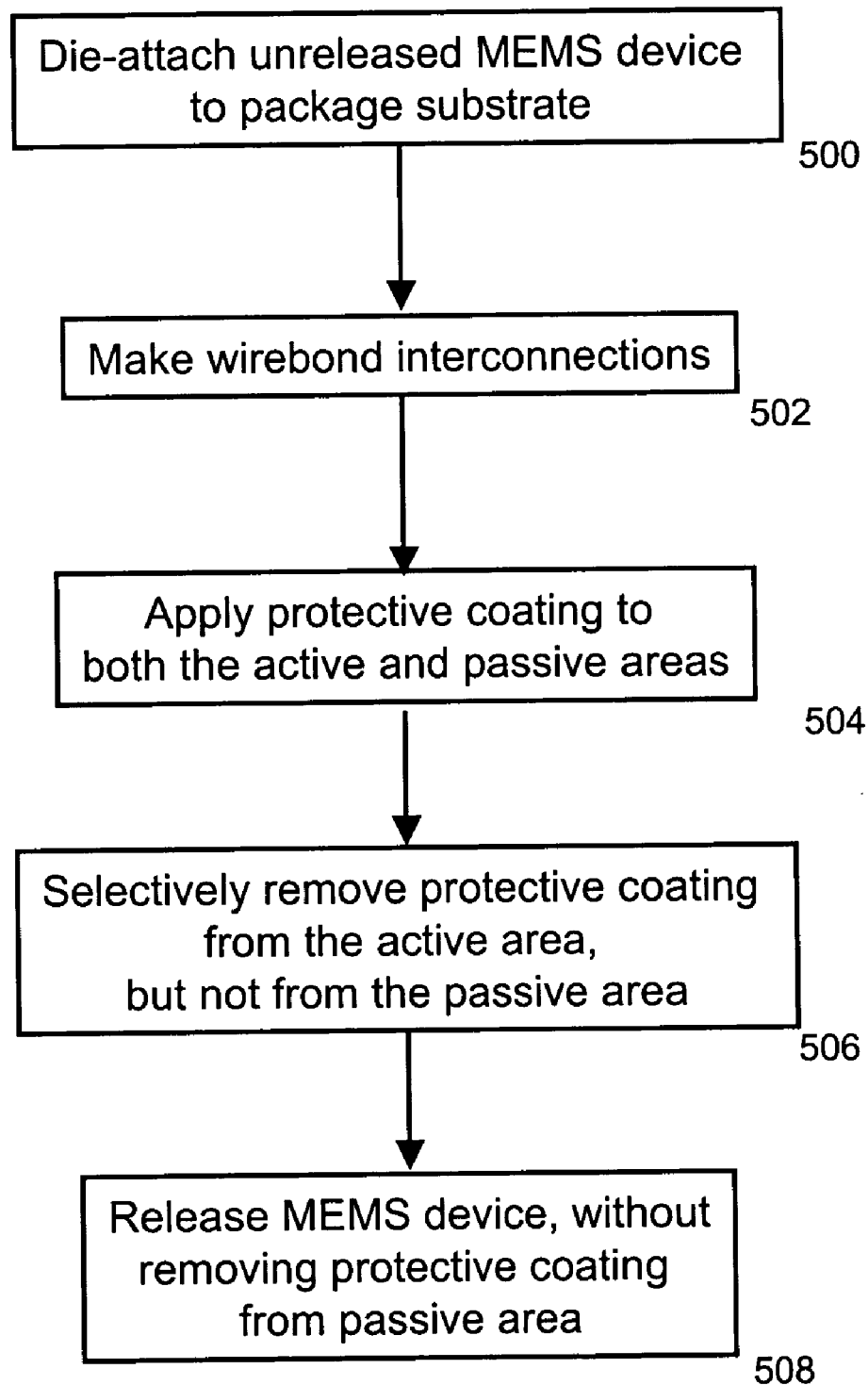
FIGS. 12a–12c shows examples of various sequences method steps for performing certain embodiments of the present invention.

FIG. 12a illustrates a fifth example of a sequence of steps for packaging a MEMS microelectronic device, according to the present invention. In step 500, an unreleased MEMS device is die-attached to a package substrate. Then, in step 502, wirebond electrical interconnections are made from the MEMS device to the package. Then, in step 504, a thin, electrically insulating protective coating is applied to both the passive and active areas. Then, in step 506, the protective coating is removed from the active area, but not from the passive area. Finally, in step 508, the MEMS device is released, without removing the protective coating from the passive area.

Figure 12B:
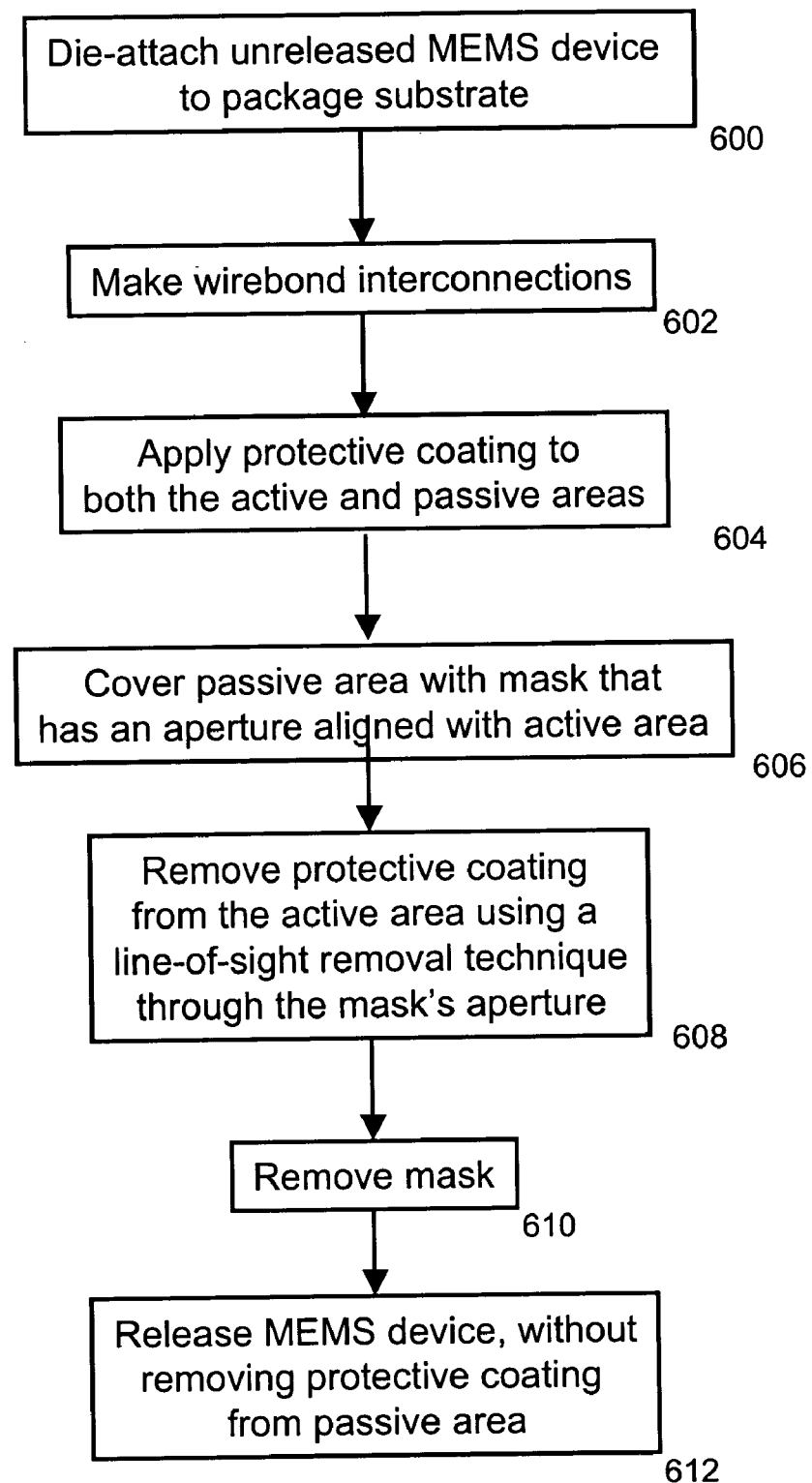

FIG. 12b illustrates a sixth example of a sequence of steps for packaging a MEMS microelectronic device, according to the present invention. In step 600, an unreleased MEMS device is die-attached to a package substrate. Then, in step 602, wirebond electrical interconnections are made from the MEMS device to the package. Then, in step 604, a thin, electrically insulating protective coating is applied to both the passive and active areas. Then, in step 606, the passive area is covered with a mask. Then, in step 608, the protective coating is removed from the active area (but not from the passive area, which is masked) using a line-of-sight removal technique, which exposes the active area. Then, in step 610, mask is removed. Finally, in step 612, the MEMS device is released, without removing the protective coating from the passive area.

Figure 12C:
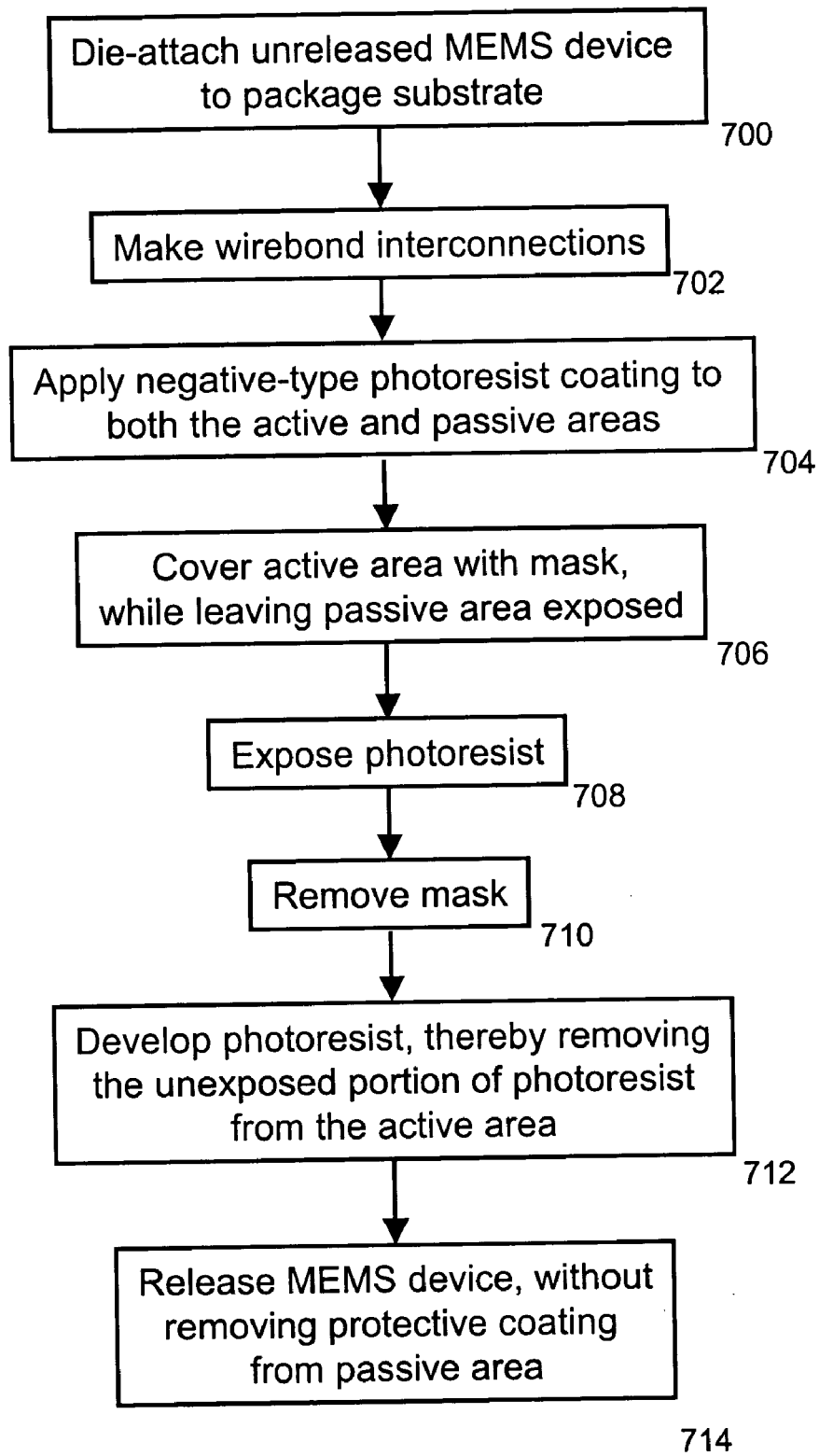

FIG. 12c illustrates a seventh example of a sequence of steps for packaging a MEMS microelectronic device, according to the present invention. In step 700, an unreleased MEMS device is die-attached to a package substrate. Then, in step 702, wirebond electrical interconnections are made from the MEMS device to the package. Then, in step 704, a thin, electrically insulating protective coating comprising a negative-type photoresist is applied to both the passive and active areas. Then, in step 706, the passive area is covered with a mask. Then, in step 708, the photoresist is exposed. Then, in step 710, the mask is removed. Then, in step 712, the photoresist is developed, which removes the unexposed portion of photoresist from the active area, thereby exposing the active area. Finally, in step 714, the MEMS device is released, without removing the protective coating from the passive area.

FIGS. 13a–13d show schematic cross-section views of a ninth example of a sequence of steps for packaging a MEMS microelectronic device, according to the present invention.

Figure 13A:
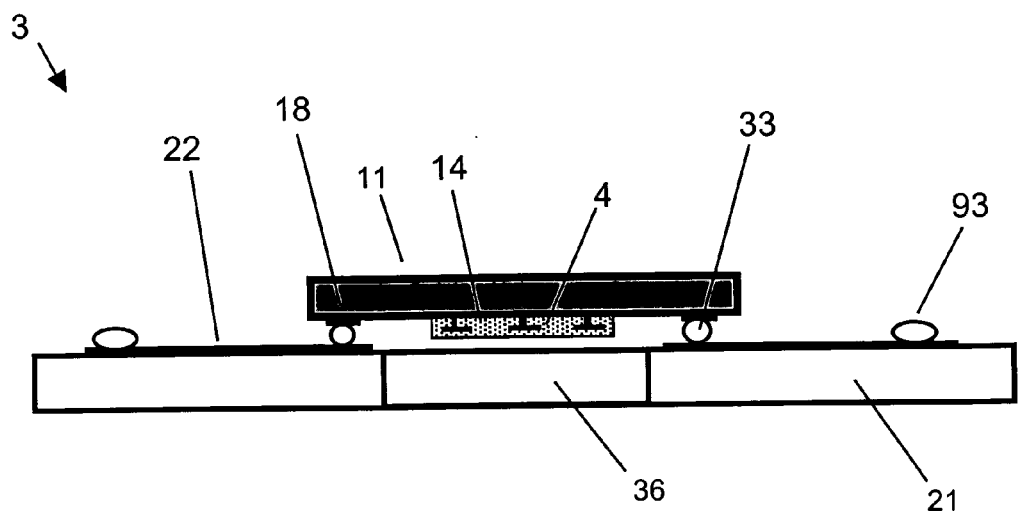
FIGS. 13a–13d show schematic cross-section views of a ninth example of a sequence of steps for packaging a MEMS microelectronic device, according to the present invention.

First, in FIG. 13a, an intermediate assembly 3 is provided, comprising a microelectronic device flip-chip mounted to an interposer 21. Interposer 21 may be made, for example, of a printed wiring board material, a plastic, a ceramic, glass, transparent glass, or a LTCC or HTCC multilayered ceramic material. The microelectronic device comprises an active area with unreleased MEMS elements 4 encased in sacrificial coating 14, disposed on silicon die 11. Interposer 21 comprises an aperture 36 that is aligned with the active area of the device. A first set of solder (or conductive polymer) balls or bumps 33 electrically interconnect bond pads 18 located on die 11 to conductive lines/traces 22 located on interposer 21. A second set of solder (or conductive polymer) balls or bumps 93 are attached to the fanned-out ends of the conductive lines/traces 22 located on interposer 21. Flip-chip interconnects 33 lie inside of the passive area.

Figure 13B:
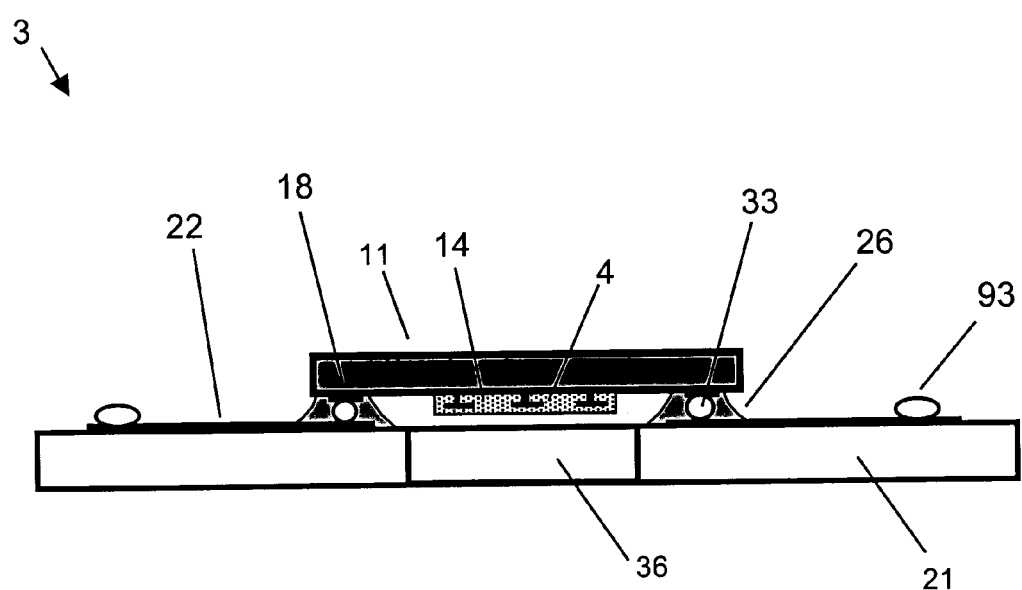

Next, in FIG. 13b, a protective coating 26 is applied to the flip-chip interconnections 33 and part of conductive lines 22 by performing a polymer underfill. Coating 26 forms a continuous ring seal around the perimeter of die 11. If the width of aperture 36 is sufficiently wide, then a polymer dispensing probe may access the flip-chip interconnections 18 through aperture 36.

Figure 13C:
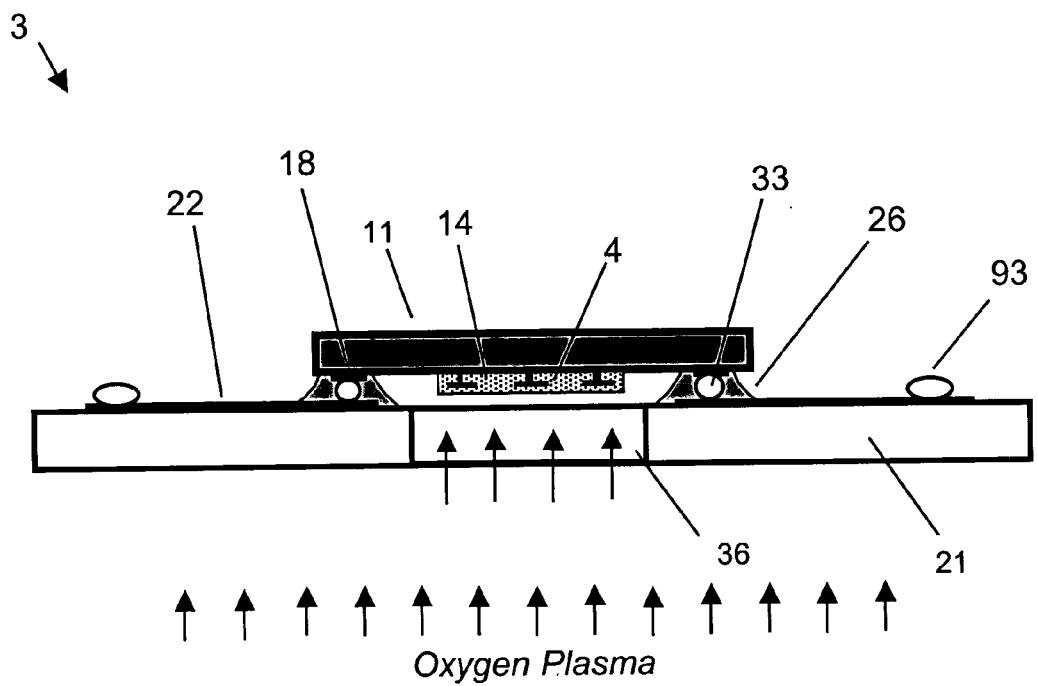

Next, in FIG. 13c, sacrificial coating 14 covering MEMS elements 4 is removed from the active area by exposing the bottom surface 37 of interposer 21 to a plasma etch streaming through aperture 36. The solid bottom surface 37 of interposer 21 serves as a natural, self-contained mask to prevent the line-of-sight plasma etch from removing the protective coating 26 from the passive area. Protective coating 26 forms a continuous ring seal that prevents any plasma etch (or chemical etch) from flowing beyond the perimeter of die 11 and attaching unprotected features in the passive area (e.g., lines 22, bumps 93, etc.).

Figure 13D:
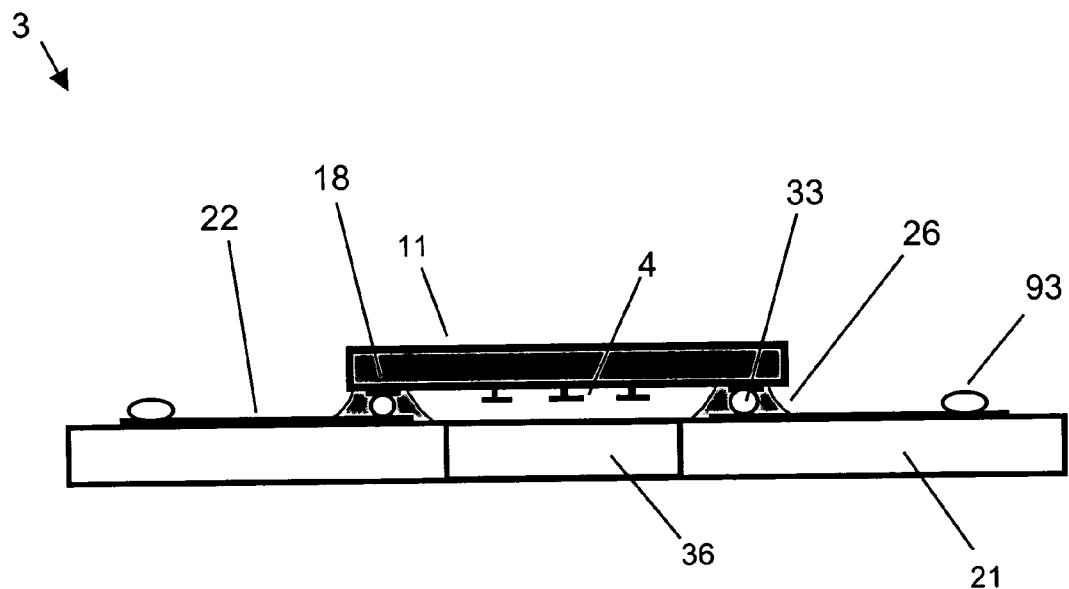

FIG. 13d shows the released, functional MEMS elements 4. Protective coating 26 remains in the passive area, protecting flip-chip interconnects 18 and portions of lines 22. The width of aperture 36 may be chosen to be sufficiently small so as to limit the lateral extent of any subsequent coatings (e.g., anti-stiction coatings, gold reflective layers on MEMS mirrors, etc.) to be no wider than necessary to cover the active area.

FIGS. 14a–14f show schematic cross-section views of a tenth example of a sequence of steps for packaging a MEMS microelectronic device, according to the present invention.

Figure 14A:
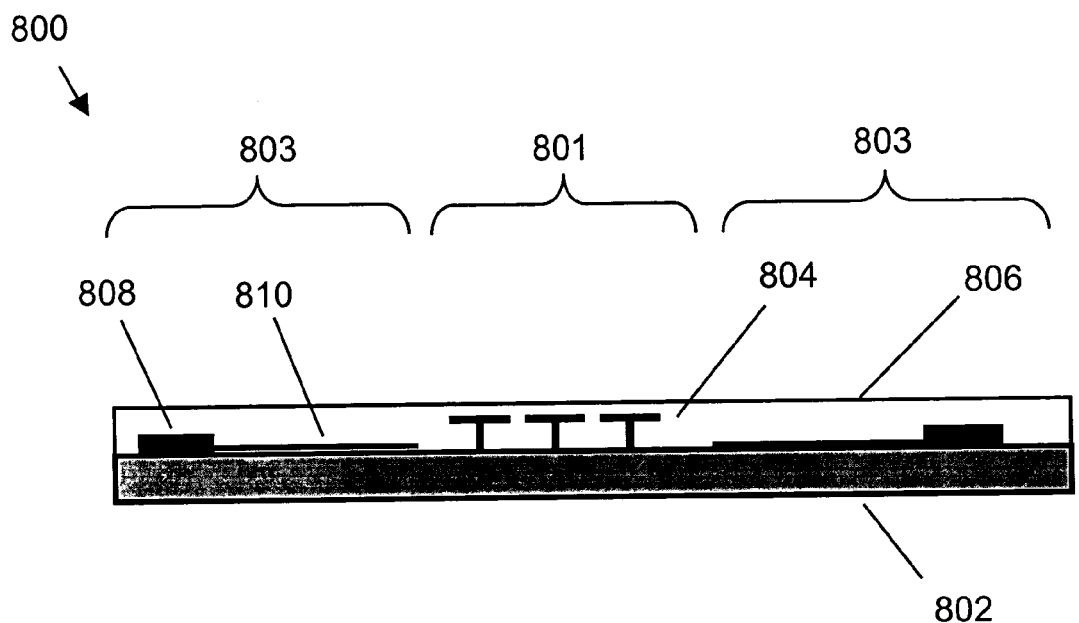
FIGS. 14a–14d show schematic cross-section views of a tenth example of a sequence of steps for packaging a MEMS microelectronic device, according to the present invention.

First, in FIG. 14a, a substrate 802 is provided, comprising MEMS elements 804, bond pads 808, and conductive traces 810, which are all covered by a sacrificial layer 806 (e.g., glass, parylene, etc. that makes MEMS elements 804 unreleased). Substrate 802 may be a silicon die with surface micro machined MEMS elements 804. Active area 801 and passive area 803 are identified.

Figure 14B:
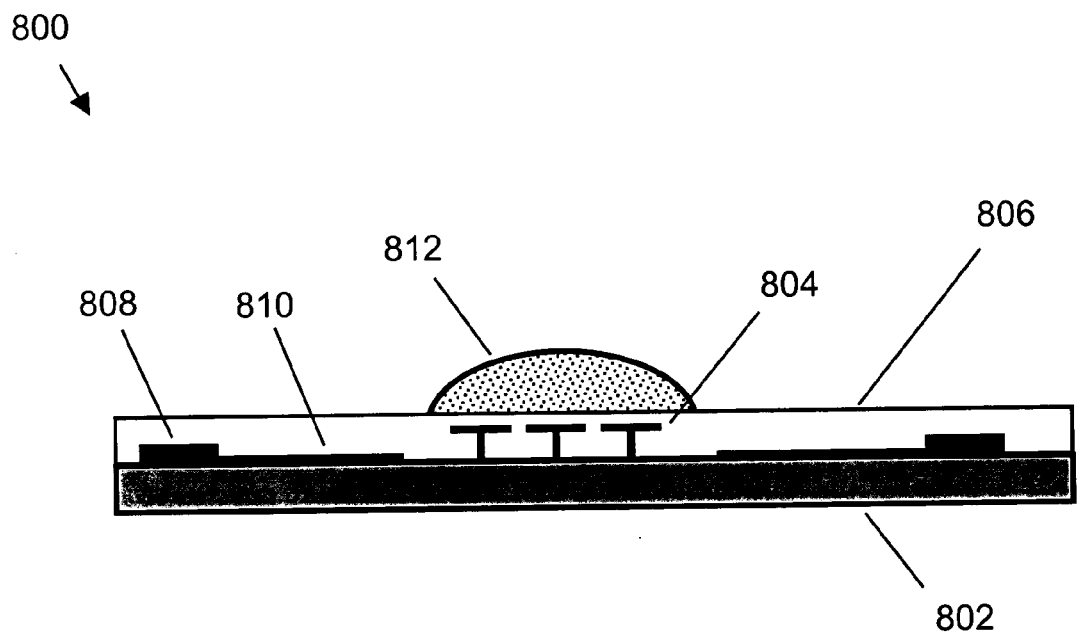

Next, in FIG. 14*b*, a glob 812 of protective material is deposited on sacrificial layer 806, covering the active area 801, but not the passive area 803. Glob 812 may be, for example, a polymeric material, a photoresist, SU-8, SU-2000, epoxy, an acid-resistant polymer, parylene, an adhesive tape, a silicone, or an elastomeric material, or combinations thereof. Glob 812 may be sprayed, screen-printed, dripped, globbed, daubed, painted, or otherwise dispensed on to layer 806. Alternatively, glob 812 may comprise a patch of adhesive tape that is placed on to layer 806. Alternatively, glob 812 may comprise a plug of an elastomeric material that is compressed on to layer 806 and held in place by an external fixture that applies a compressive force. Alternatively, glob 812 may comprise a coating of parylene polymer, that was applied while the passive area 803 was temporarily masked (e.g., with adhesive tape).

Figure 14C:
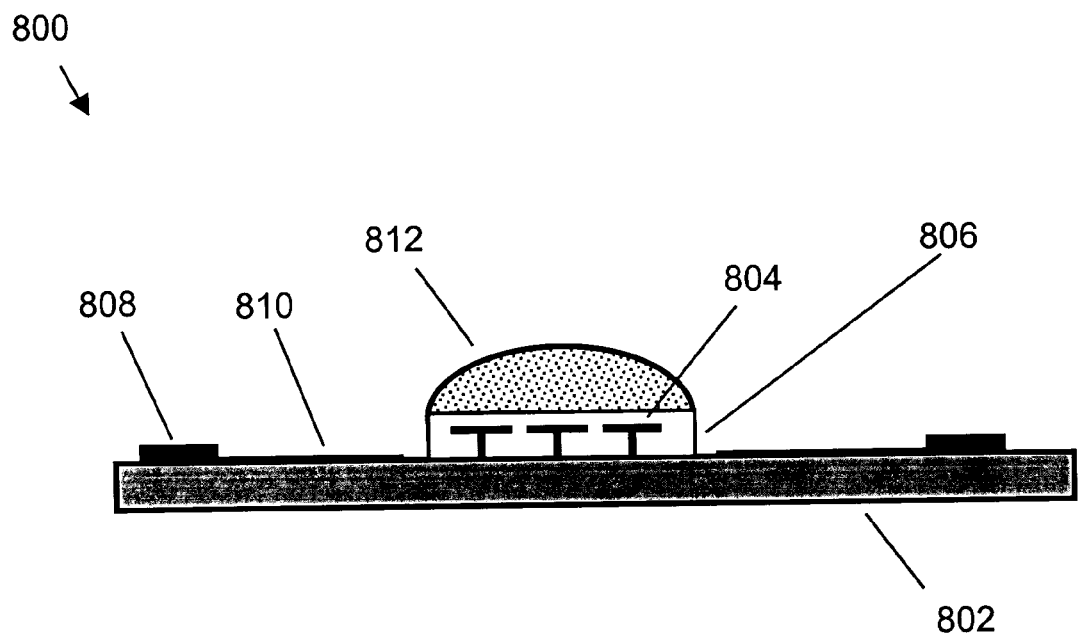

Next, in FIG. 14*c*, that portion of sacrificial layer 806 that covers the passive area 803 is completely removed, e.g., by wet acid etching, dry plasma etching, etc. The presence of glob 812 prevents removal of sacrificial layer 806 that surrounds MEMS elements 804 (i.e., in the passive area 801). In the case where glob 812 is made of a photoresist material, exposure to wet acid etchants may also remove some of the glob itself. In this case, repeated reapplications of glob 812 may be required, followed by a cycle of etching, and so on (e.g., four cycles).

Figure 14D:
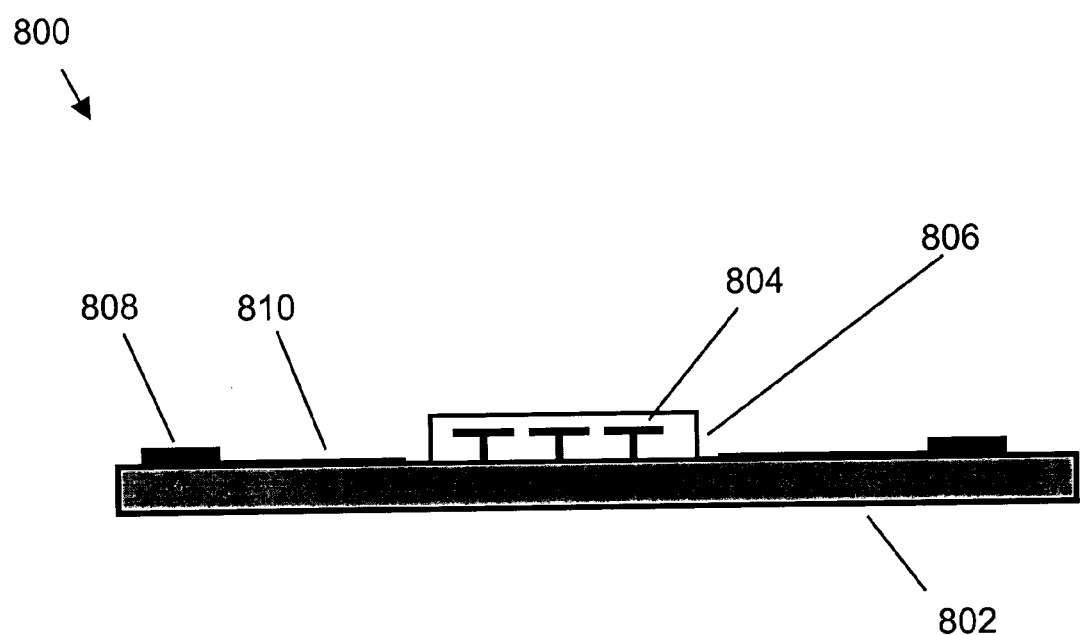

Next, in FIG. 14*d*, the glob 812 of protective material is removed, for example, by exposing assembly to acetone by dipping, spraying, etc. (which dissolves photoresists and common adhesives). Alternatively, if glob 812 comprises adhesive tape, then it can be removed by peeling away. Alternatively, if glob 812 comprises a compressed plug of an elastomeric material, then it can be removed by removing the compressive force and taking away the elastomeric plug. Removing glob 812 exposes the remaining part of sacrificial layer 806 that covers active area 801. Note that the assembly shown in FIG. 14*d* is essentially the same as that shown in FIG. 2*b*. Hence, the fabrication steps described in this section with regard to FIGS. 14*a*–14*d*, can be viewed as one example of how one might proceed to get from the assembly shown in FIG. 2*a* to the assembly shown in FIG. 2*b*.

The preceeding examples can be repeated with similar success by substituting the generically or specifically described reactants and/or operating conditions of this invention for those used in the preceding examples.

Although the invention has been described in detail with particular reference to these preferred embodiments, other embodiments can achieve the same results. Variations and modifications of the present invention will be obvious to those skilled in the art and it is intended to cover in the appended claims all such modifications and equivalents. The entire disclosures of all references, applications, patents, and publications cited above are hereby incorporated by reference.

What is claimed is:

1. A microelectronic device, comprising:
an electrically insulating substrate;
a first electrical conductor disposed on the substrate;
a microelectronic device attached to the substrate, wherein the device comprises an active area and a passive area;
a second electrical conductor disposed on the device, located within the passive area;
an electrical interconnection formed between the first and second electrical conductors; and
an electrically insulating, protective coating covering the first and second electrical conductors, the electrical interconnection, and the passive area, a portion of the protective coating being removed so as to expose the active area before MEMS elements in the active area being released;
wherein the thickness of the protective coating is less than or equal to 100 microns.

2. The microelectronic device of claim 1, wherein the substrate comprises one or more electrically insulating materials selected from the group consisting of ceramic, plastic, printed wiring board material, polymer, multi-layered material, LTCC ceramic multilayered material, and HTCC ceramic multilayered material.

3. The microelectronic device of claim 1, wherein the substrate comprises a package having a geometry selected from the group consisting of DIP, ceramic dual inline packaging (or, CERDIP), quad flatpack, pin grid array, leadless chip carrier, and a leaded flatpack.

4. The microelectronic device of claim 1, comprising one or more active elements, disposed within the active area, selected from the group consisting of optically sensitive elements, temperature sensitive elements, heat sensitive elements, chemical sensitive elements, pressure sensitive elements, and microsensors.

5. The microelectronic device of claim 1, wherein the electrical interconnection comprises a wirebond or a flip-chip ball or bump.

6. The microelectronic device of claim 1, wherein the device is flip-chip mounted to the substrate, and wherein the substrate comprises an aperture aligned over the active area, whereby the active area is accessible through the aperture.

7. The microelectronic device of claim 6, wherein the package comprises a transparent window disposed across the aperture.

8. The microelectronic device of claim 1, wherein the electrically insulating protective coating comprises one or more materials selected from the group consisting of a vapor-deposited coating, a vacuum vapor deposited coating, a chemical vapor deposited coating, a water-insoluble coating, a water-soluble coating, a dry-etchable coating, a conformal coating, a pin-hole free coating, parylene, a photo-patternable/photoimagable material, photoresist, a low viscosity photoresist, an epoxy based negative resist, SU-8, SU-8 2000, a sputtered coating, an evaporated coating, a ceramic coating, silicon nitride, aluminum oxide, mullite, a sprayed coating, a self-assembled monolayered material, cyanoacrylate, perfluoropolyether, hexamethyldisilazane, perfluorodecanoic carboxylic acid, silicon dioxide, TEOS, silicate glass, a fast-etch glass, silicon, and polysilicon.

9. The microelectronic device of claim 1, wherein the electrically insulating protective coating comprises one or more materials selected from the group consisting of poly-para-xylylene, poly-para-xylylene that has been modified by the substitution of a chlorine atom for one of the aromatic hydrogens, and poly-para-xylylene that has been modified by the substitution of the chlorine atom for two of the aromatic hydrogens.

10. The microelectronic device of claim 1, wherein the passive area comprises an integrated circuit.

11. The microelectronic device of claim 1, further comprising an electrically conductive overcoat deposited on top of the electrically insulating protective coating, whereby the electrically conductive overcoat provides electromagnetic shielding.

12. The microelectronic device of claim 11, wherein the electrically conductive overcoat comprises one or more conductive materials selected from the group consisting of a metal, gold, tungsten, nickel, aluminum, copper, titanium, molybdenum, tin, tantalum, a metal alloy, an electrically-conductive polymer, carbon, doped carbon, and doped silicon.

13. The microelectronic device of claim 1, wherein the conductive overcoat is continuous across two or more adjacent electrical interconnections.

14. The microelectronic device of claim 1, wherein the substrate comprises an interposer or an interposer with an aperture aligned with the active area.

15. The microelectronic device of claim 1, wherein the thickness of the protective coating is less than or equal to 100 angstroms.

* * * * *